United States Patent
Kim et al.

(10) Patent No.: US 11,289,588 B2
(45) Date of Patent: Mar. 29, 2022

(54) SEMICONDUCTOR DEVICE INCLUDING TWO THIN-FILM TRANSISTORS AND METHOD OF FABRICATING THE SAME

(71) Applicant: SAMSUNG DISPLAY CO., LTD., Yongin-si (KR)

(72) Inventors: Jaybum Kim, Seoul (KR); Seryeong Kim, Asan-si (KR); Junhyung Lim, Seoul (KR); Taesang Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/824,339

(22) Filed: Mar. 19, 2020

(65) Prior Publication Data
US 2020/0219991 A1    Jul. 9, 2020

Related U.S. Application Data

(63) Continuation of application No. 15/730,475, filed on Oct. 11, 2017, now Pat. No. 10,629,705.

(30) Foreign Application Priority Data

Feb. 13, 2017    (KR) .................. 10-2017-0019596

(51) Int. Cl.
*H01L 29/786*    (2006.01)
*H01L 29/66*    (2006.01)
(Continued)

(52) U.S. Cl.
CPC ...... *H01L 29/6675* (2013.01); *H01L 27/1222* (2013.01); *H01L 27/1225* (2013.01);
(Continued)

(58) Field of Classification Search
CPC ......... H01L 29/78645; H01L 29/78648; H01L 29/7869; H01L 29/78693; H01L 27/1225; H01L 27/326–3265; H01L 27/1251
See application file for complete search history.

(56) References Cited

U.S. PATENT DOCUMENTS 5,041,884 A    8/1991  Kumamoto et al.
5,585,647 A *  12/1996 Nakajima ........... H01L 27/1251
                                                         257/72
(Continued)

FOREIGN PATENT DOCUMENTS

JP          5121221        1/2013
KR      1020070072207      7/2007
(Continued)

*Primary Examiner* — Eric A. Ward
(74) *Attorney, Agent, or Firm* — F. Chau & Associates, LLC

(57) ABSTRACT

A semiconductor device includes a base substrate. A first thin-film transistor is disposed on the base substrate. The first thin-film transistor includes a first input electrode, a first output electrode, a first semiconductor pattern disposed below a first insulating layer, and a first control electrode disposed on the first insulating layer and below a second insulating layer. A second thin-film transistor includes a second input electrode, a second output electrode, a second semiconductor pattern disposed on the second insulating layer, and a second control electrode disposed on an insulating pattern formed on the second semiconductor pattern and exposes a portion of the second semiconductor pattern. The first semiconductor pattern includes a crystalline semiconductor. The second semiconductor pattern includes an oxide semiconductor. The first semiconductor pattern, the first control electrode, the second semiconductor pattern, and the second control electrode are overlapped.

6 Claims, 28 Drawing Sheets

(51) Int. Cl.
*H01L 27/32* (2006.01)
*H01L 27/146* (2006.01)
*H01L 29/04* (2006.01)
*H01L 27/12* (2006.01)

(52) U.S. Cl.
CPC ...... *H01L 27/1251* (2013.01); *H01L 27/1255* (2013.01); *H01L 27/14692* (2013.01); *H01L 27/3225* (2013.01); *H01L 27/3262* (2013.01); *H01L 27/3265* (2013.01); *H01L 29/04* (2013.01); *H01L 29/66969* (2013.01); *H01L 29/7869* (2013.01); *H01L 27/3248* (2013.01)

(56) References Cited

U.S. PATENT DOCUMENTS

| | | |
|---|---|---|
| 5,612,552 A | 3/1997 | Owens |
| 6,627,953 B1 | 9/2003 | Vu et al. |
| 7,306,981 B2 | 12/2007 | Kuwabara et al. |
| 7,772,711 B2 | 8/2010 | Noguchi et al. |
| 8,124,325 B2 | 2/2012 | Speakman |
| 9,129,927 B2 | 9/2015 | Gupta et al. |
| 10,121,899 B2 | 11/2018 | Moon et al. |
| 2009/0155940 A1* | 6/2009 | Lee ........................ H01L 29/786 438/29 |
| 2010/0025676 A1* | 2/2010 | Yamazaki ......... H01L 29/66969 257/43 |
| 2012/0091460 A1 | 4/2012 | Park et al. |
| 2012/0146004 A1 | 6/2012 | Lee et al. |
| 2013/0240886 A1 | 9/2013 | Yeh et al. |
| 2015/0171154 A1* | 6/2015 | Kang ................... H01L 27/3262 257/40 |
| 2016/0079285 A1 | 3/2016 | Chiang et al. |
| 2016/0240565 A1 | 8/2016 | Kim et al. |
| 2016/0276374 A1 | 9/2016 | Nodera et al. |
| 2016/0307988 A1 | 10/2016 | Kim et al. |
| 2017/0343844 A1 | 11/2017 | Aoki |
| 2018/0061868 A1* | 3/2018 | Na ..................... H01L 29/42384 |
| 2018/0144685 A1 | 5/2018 | Gong et al. |
| 2018/0233575 A1 | 8/2018 | Kim et al. |

FOREIGN PATENT DOCUMENTS

| | | |
|---|---|---|
| KR | 100891987 | 3/2009 |
| KR | 1020150100516 | 9/2015 |
| KR | 1020150101417 | 9/2015 |
| KR | 101672091 | 10/2016 |

* cited by examiner

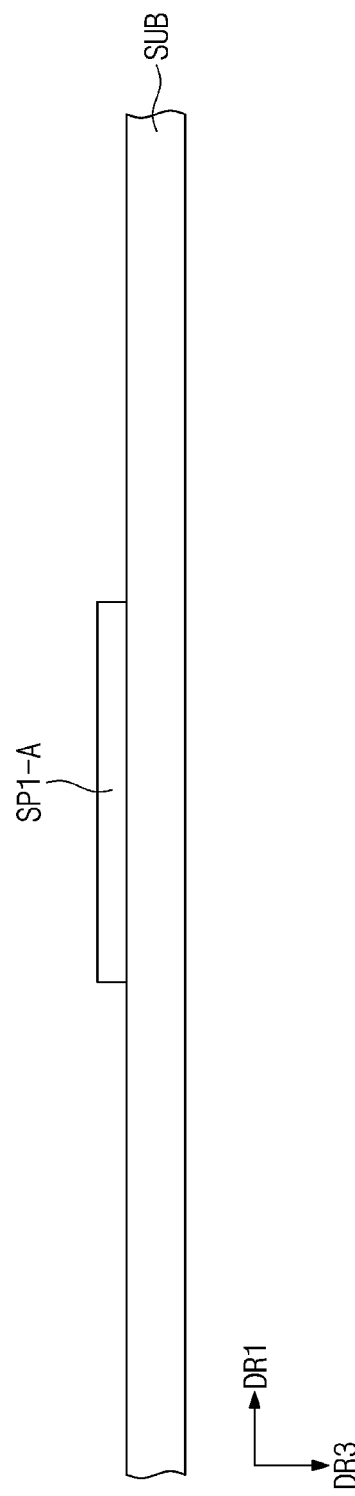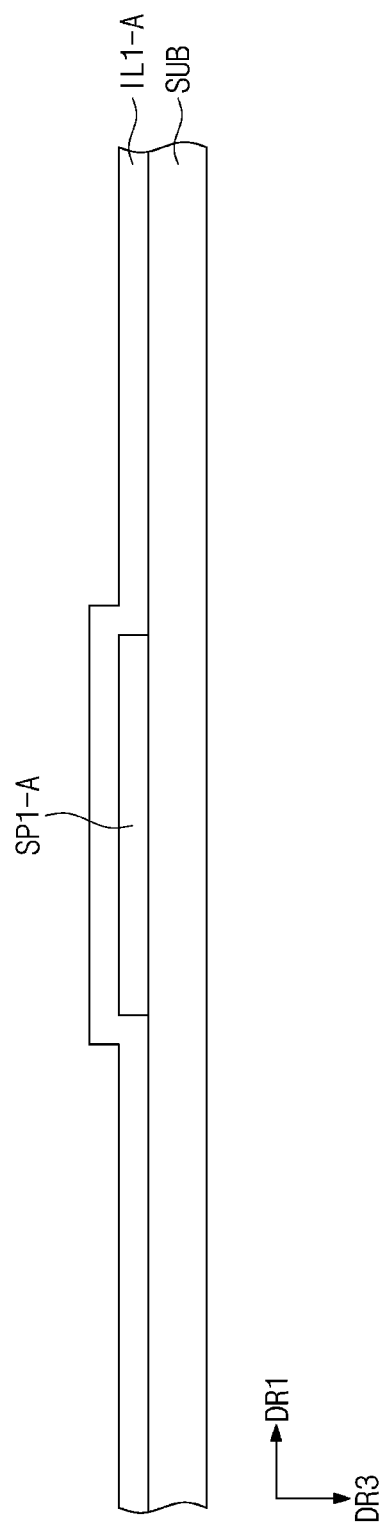

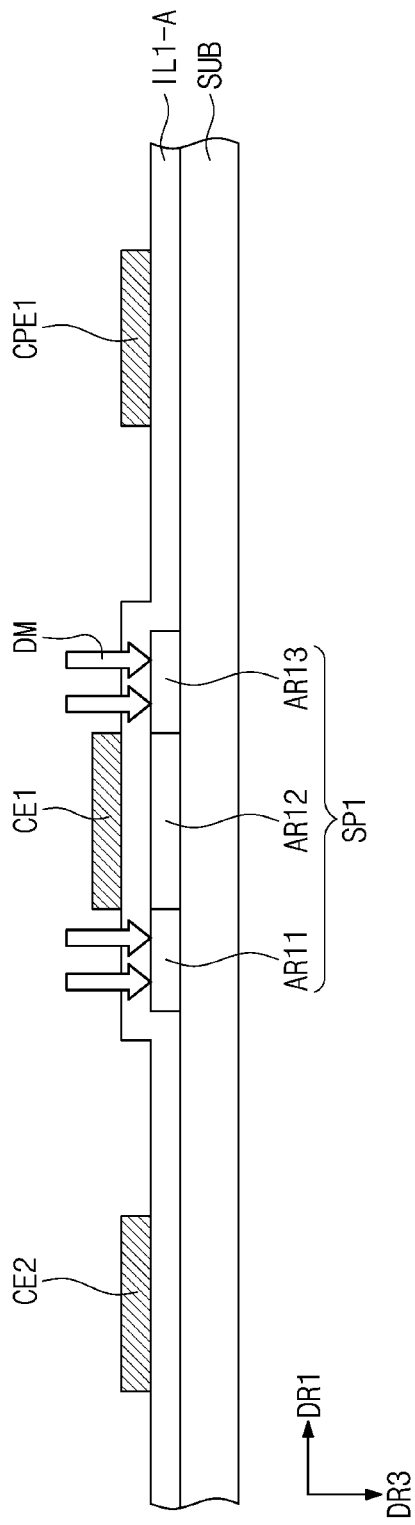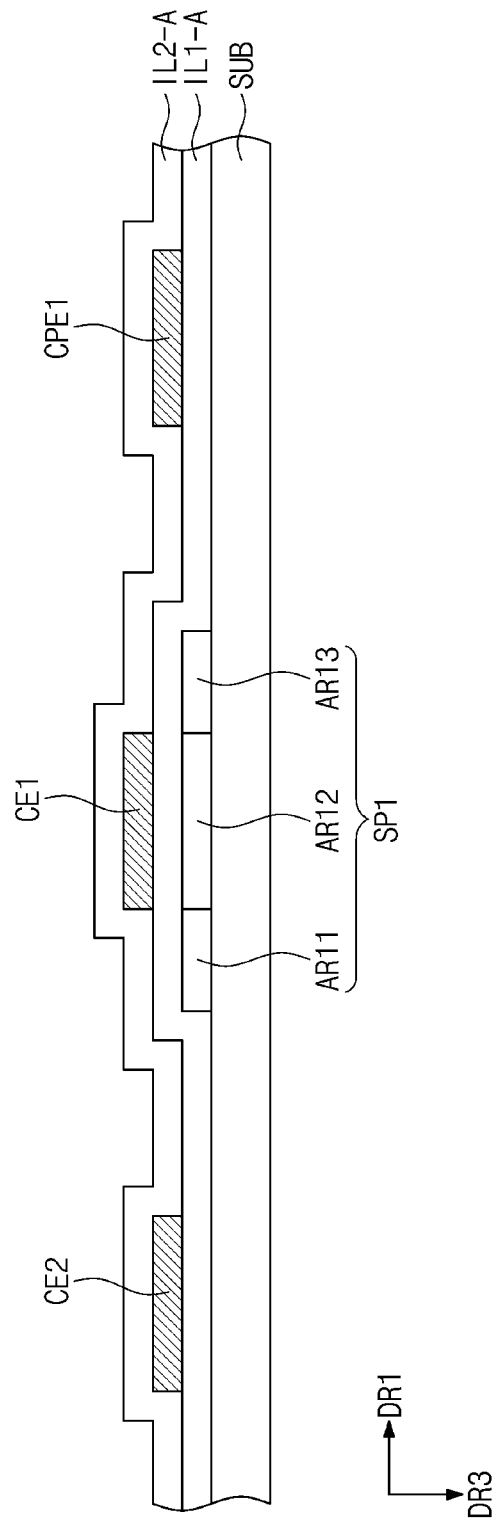

US 11,289,588 B2

SEMICONDUCTOR DEVICE INCLUDING TWO THIN-FILM TRANSISTORS AND METHOD OF FABRICATING THE SAME

CROSS-REFERENCE TO RELATED APPLICATIONS

This application is a Continuation of co-pending U.S. patent application Ser. No. 15/730,475, filed on Oct. 11, 2017, which claims priority under 35 U.S.C. § 119 to Korean Patent Application No. 10-2017-0019596, filed on Feb. 13, 2017, in the Korean Intellectual Property Office, the entire content of which is hereby incorporated by reference.

TECHNICAL FIELD

The present disclosure relates to a semiconductor device, and more particularly, to a semiconductor device and a method of fabricating the same.

DISCUSSION OF RELATED ART

A semiconductor device may include at least one thin-film transistor. The thin-film transistor may include a semiconductor pattern made of a semiconductor material. A display device, which is an example of the semiconductor device, generally includes a plurality of pixels and a driving circuit for controlling the pixels. The driving circuit may include at least one thin-film transistor. The thin-film transistor of the driving circuit may be configured to provide electrical control signals to the pixel.

Each of the pixels may include a pixel driving circuit and a display element connected to the pixel driving circuit. The pixel driving circuit may include at least one thin-film transistor and at least one capacitor. The thin-film transistor and the capacitor of the pixel driving circuit may control the display element, based on electrical signals provided from the driving circuit.

SUMMARY

A semiconductor device includes a base substrate. A first thin-film transistor is disposed on the base substrate. The first thin-film transistor includes a first input electrode, a first output electrode, a first semiconductor pattern, which is disposed below a first insulating layer, and a first control electrode, which is disposed on the first insulating layer and below a second insulating layer. A second thin-film transistor includes a second input electrode, a second output electrode, a second semiconductor pattern, which is disposed on the second insulating layer, and a second control electrode, which is disposed on an insulating pattern that is formed on the second semiconductor pattern and exposes a portion of the second semiconductor pattern. The first semiconductor pattern includes a crystalline semiconductor material. The second semiconductor pattern includes an oxide semiconductor material. The first semiconductor pattern, the first control electrode, the second semiconductor pattern, and the second control electrode are all overlapped with each other.

A semiconductor device includes a base substrate. A first thin-film transistor, a second thin-film transistor, and a first capacitor are disposed on the base substrate. The first thin-film transistor includes a first input electrode, a first output electrode, a first semiconductor pattern containing a crystalline semiconductor material, and a first control electrode disposed on the first semiconductor pattern. The second thin-film transistor includes a second input electrode, a second output electrode, a second control electrode, and a second semiconductor pattern, which is disposed on the second control electrode and contains an oxide semiconductor material, and a second conductive pattern, which is disposed on the second semiconductor pattern and exposes a portion of the second semiconductor pattern. The first capacitor includes a first electrode, a second electrode disposed on the first electrode, and a third semiconductor pattern, which is disposed between the first electrode and the second electrode and contains an oxide semiconductor of the second semiconductor pattern.

A method of fabricating a semiconductor device includes forming a first semiconductor pattern, including a crystalline semiconductor material, on a base substrate. A first insulating layer is formed on the base substrate to cover the first semiconductor pattern. A first control electrode is formed on the first insulating layer that is overlapped with the first semiconductor pattern. A second insulating layer is formed on the first insulating layer covering the first control electrode. A second semiconductor pattern is formed on the second insulating layer. The second semiconductor pattern includes an oxide semiconductor material and is overlapped with the first semiconductor pattern and the first control electrode. A second control electrode is formed on the second semiconductor pattern overlapped with the first semiconductor pattern, the first control electrode, and the second semiconductor pattern.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 14A to 14K are cross-sectional views sequentially illustrating process steps in a process of fabricating a semiconductor device according to exemplary embodiments of the present disclosure and FIGS. 15A to 15L are cross-sectional views sequentially illustrating process steps in a process of fabricating a semiconductor device according to exemplary embodiments of the present disclosure.

DETAILED DESCRIPTION

Figure 1:
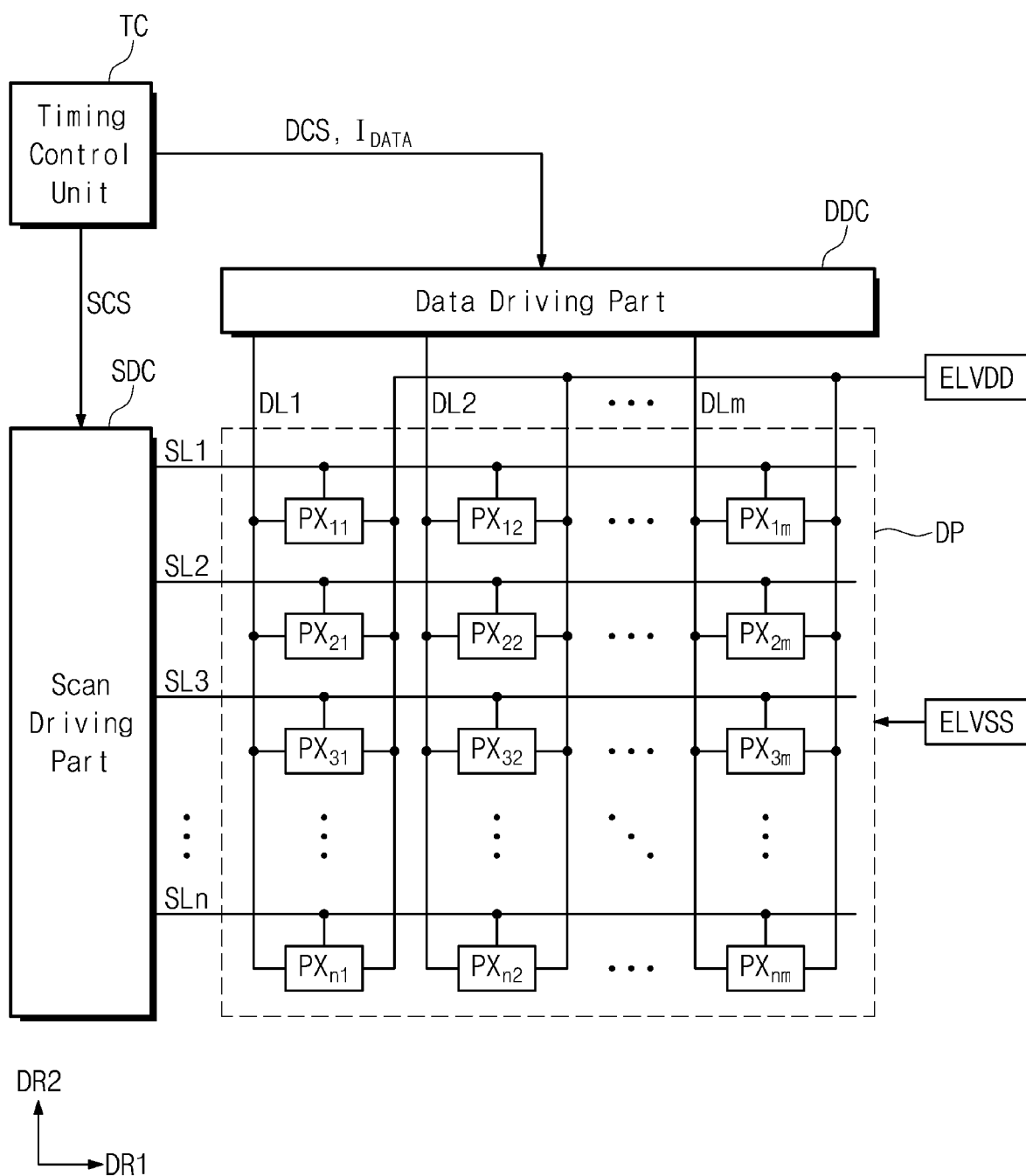
FIG. 1 is a block diagram illustrating a semiconductor device according to exemplary embodiments of the present disclosure.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the drawings, the thicknesses of layers and regions may be exaggerated for clarity. Like reference numerals may denote like elements throughout the drawings and disclosure, and thus to the extent that additional description is omitted, it may be assumed that the omitted description is similar to or identical to corresponding elements that have already been described.

It will be understood that when an element is referred to as being "connected" or "coupled" to another element, it can be directly connected or coupled to the other element or intervening elements may be present. Hereinafter, a semiconductor device according to exemplary embodiments of the present disclosure will be described with reference to FIGS. 1 to 8.

Figure 2:
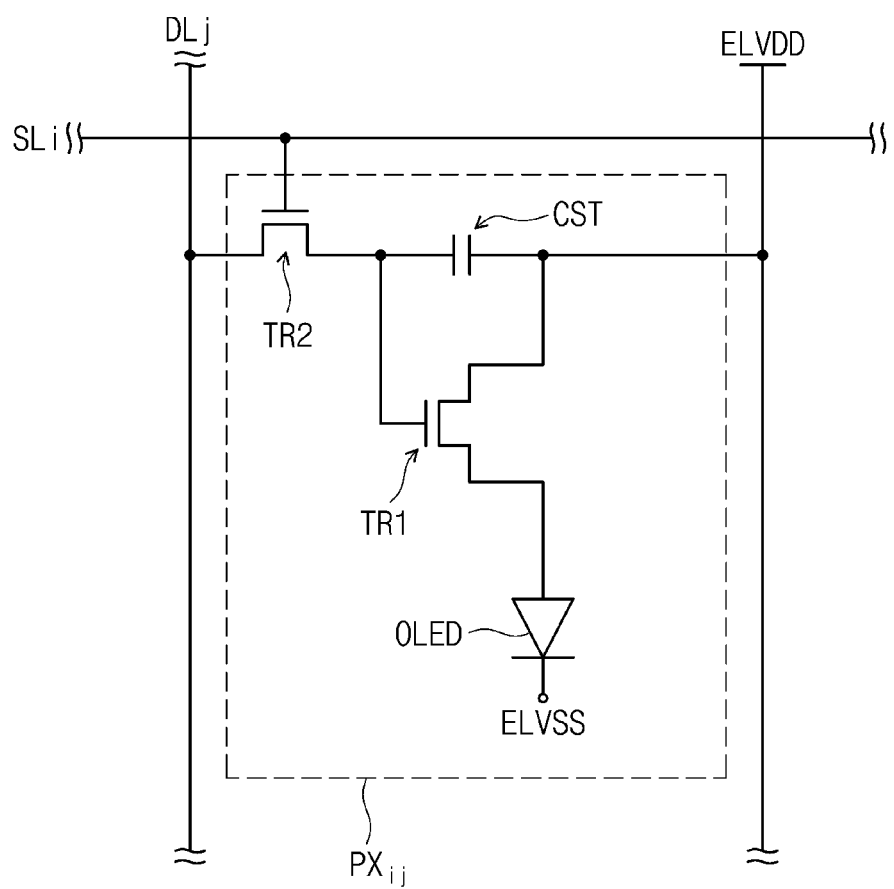
FIG. 2 is a circuit diagram illustrating a pixel shown in FIG. 1 in accordance with exemplary embodiments of the present disclosure.

FIG. 1 is a block diagram illustrating a semiconductor device according to exemplary embodiments of the present disclosure. FIG. 2 is a circuit diagram illustrating a pixel shown in FIG. 1.

Referring to FIG. 1, a semiconductor device, according to exemplary embodiments of the present disclosure, may include a timing control unit TC, a scan driving part SDC, a data driving part DDC, and a display panel DP. The display panel DP may be configured to display an image using electrical signals provided thereto. Hereinafter, a light-emitting type display panel will be described as an example of the display panel DP. However, other types of display panels may be used.

The timing control unit TC may be configured to receive input image signals and to output image data $I_{DATA}$ and various control signals SCS and DCS. The image data $I_{DATA}$ may be converted to a form suitable for an operation mode of the display panel DP.

The scan driving part SDC may receive a scan control signal SCS from the timing control unit TC. The scan driving part SDC may generate a plurality of gate signals, in response to the scan control signal SCS. The scan control signal SCS may include a vertical start signal to initiate an operation of the scan driving part SDC, a clock signal to determine when to output signals, and other related control signals.

The data driving part DDC may receive a data driving control signal DCS and the converted image data $I_{DATA}$ from the timing control unit TC. The data driving part DDC may produce a plurality of data signals, based on the data driving control signal DCS and the converted image data $I_{DATA}$. The data signals may be provided to the display panel DP.

The display panel DP may display an image in accordance with electrical signals provided from an external source. The display panel DP may include a plurality of scan lines SL1-SLn, a plurality of data lines DL1-DLm, and a plurality of pixels $PX_{11}$-$PX_{nm}$.

The scan lines SL1-SLn may extend in a first direction DR1 and may be arranged in a second direction DR2 crossing the first direction DR1. The scan lines SL1-SLn may be sequentially applied with scan signals, which are produced by the scan driving part SDC.

The data lines DL1-DLm may be disposed to cross the scan lines SL1-SLn and may be electrically isolated from the scan lines SL1-SLn. The data lines DL1-DLm may extend in the second direction DR2 and may be arranged in the first direction DR1. The data lines DL1-DLm may receive data signals from the data driving part DDC.

The display panel DP may receive a first power voltage ELVDD and a second power voltage ELVSS, which are supplied from an external device. Each of the pixels $PX_{11}$-$PX_{nm}$ may be turned-on in response to the corresponding scan signal. Each of the pixels $PX_{11}$-$PX_{nm}$ may receive the first power voltage ELVDD and the second power voltage ELVSS and may generate light in response to the corresponding scan signal. The first power voltage ELVDD may be higher than the second power voltage ELVSS.

The pixels $PX_{11}$-$PX_{nm}$ may be arranged in the form of matrix. Each of the pixels $PX_{11}$-$PX_{nm}$ may be connected to a corresponding one of the scan lines SL1-SLn and a corresponding one of the data lines DL1-DLm.

Each of the pixels $PX_{11}$-$PX_{nm}$ may receive a scan signal from the corresponding scan line and may receive a data signal from the corresponding data line. Each of the pixels $PX_{11}$-$PX_{nm}$ may be turned-on in response to the corresponding scan signal. When the display panel DP is used to display an image, each of the pixels $PX_{11}$-$PX_{nm}$ may generate light in response to the corresponding data signal.

Referring to FIG. 2, each of the pixels $PX_{11}$-$PX_{nm}$ may include an organic light emitting diode OLED and a pixel driving circuit, which is configured to control a light emitting operation of the organic light emitting diode OLED. The pixel driving circuit may include a plurality of thin-film transistors TR1 and TR2 and a capacitor CST. At least one of the scan and data driving parts SDC and DDC may include thin-film transistors, which are formed using the same process as that for forming the pixel driving circuit. An organic light emitting diode including an organic light emitting layer will be described as an example of a light-emitting diode according to exemplary embodiments of the present disclosure. However, the present disclosure is not limited thereto. For example, a light emitting layer of the light-emitting diode may include an inorganic luminescence material, such as a quantum dot, a quantum rod, and/or a quantum tube. Hereinafter, an organic light emitting display panel will be described as an example of the light-emitting display panel according to exemplary embodiments of the present disclosure.

A plurality of photolithography processes may be performed to form the scan lines SL1-SLn, the data lines DL1-DLm, the pixels PX11-PXnm, the scan driving part SDC, and the data driving part DDC on a base substrate. A plurality of deposition or coating processes may be performed to form insulating layers on the base substrate. Each of the insulating layers may be a relatively thin layer, which is formed to cover the entirety of the display panel DP, or at least one insulating pattern thereof, which is overlapped with a portion of the display panel DP. The insulating layers may include inorganic and/or organic materials. In addition, on the base substrate, an encapsulation layer may be formed to protect the pixels $PX_{11}$-$PX_{nm}$.

FIG. 2 is a diagram illustrating an example of a circuit of a pixel $PX_{ij}$, which is connected to one of the scan lines SL1-SLn (e.g., i-th scan line SLi) and one of the data lines DL1-DLm (e.g., j-th data line DLj). The structure of the driving circuit may be variously changed from that of the pixel driving circuit shown in FIG. 2.

The pixel $PX_j$ may include an organic light emitting diode OLED and a pixel driving circuit, which is configured to control the organic light emitting diode OLED. The pixel driving circuit may include a first thin-film transistor TR1, a second thin-film transistor TR2, and a capacitor CST.

The first thin-film transistor TR1 may include a control electrode, an input electrode, and an output electrode. The control electrode of the first thin-film transistor TR1 may be connected to an output electrode of the second thin-film transistor TR2 and a first capacitor electrode of the capacitor CST, an input electrode of the first thin-film transistor TR1 may be applied with the first power voltage ELVDD, and the output electrode of the first thin-film transistor TR1 may be connected to the organic light emitting diode OLED.

The first thin-film transistor TR1 may control an amount of a driving current passing through the organic light emitting diode OLED, based on an amount of electric charge stored in the capacitor CST. An operation time taken to turn on the first thin-film transistor TR1 may be dependent on an amount of electric charge stored in the capacitor CST. A voltage, which is supplied to the organic light emitting diode OLED through the output electrode of the first thin-film transistor TR1, may be lower than the first power voltage ELVDD. In some exemplary embodiments of the present disclosure, the first thin-film transistor TR1 may serve as a driving transistor.

The organic light emitting diode OLED may include a first electrode, which is connected to the first thin-film transistor TR1, and a second electrode, which is used to receive the second power voltage ELVSS. The organic light emitting diode OLED may include a light-emitting pattern disposed between the first and second electrodes.

The organic light emitting diode OLED may be configured to emit light when the first thin-film transistor TR1 is turned-on. A color (e.g., wavelength) of light emitted from the organic light emitting diode OLED may be determined by a material used for the light-emitting pattern. For example, the organic light emitting diode OLED may be configured emit red, green, blue, or white light.

The second thin-film transistor TR2 may include a control electrode, which is connected to the i-th scan line SLi, an input electrode, which is connected to the j-th data line DLj, and an output electrode. The second thin-film transistor TR2 may output a data signal, which is applied to the j-th data line DLj, in response to a scan signal applied to the i-th scan line SLi. In some exemplary embodiments of the present inventive concept, the second thin-film transistor TR2 may serve as a control transistor or a switching transistor. Although FIG. 2 illustrates an example in which a single thin-film transistor is used as the control transistor, other arrangements may be used. For example, the control transistor may include one or more thin-film transistors (e.g., five or six thin-film transistors).

The capacitor CST may include the first capacitor electrode, which is connected to the second thin-film transistor TR2, and a second capacitor electrode, which is used to receive the first power voltage ELVDD. In some exemplary embodiments of the present inventive concept, an amount of electric charge to be stored in the capacitor CST may be determined by a difference in voltage between a data signal, which is transmitted through the second thin-film transistor TR2, and the first power voltage ELVDD.

The present disclosure is not necessarily limited to the embodiments described above. For example, various shapes of transistors may be used for the semiconductor device according to some exemplary embodiments of the present disclosure.

Figure 3:
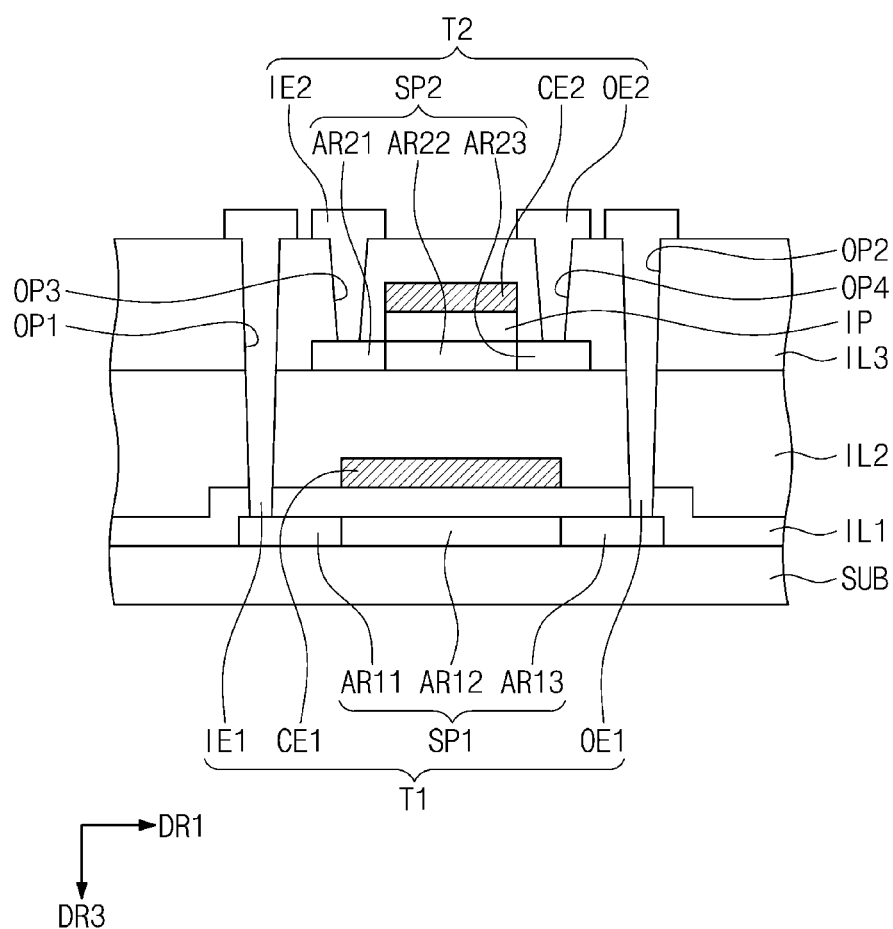
FIG. 3 is a cross-sectional view illustrating a semiconductor device according to exemplary embodiments of the present disclosure.

FIG. 3 is a cross-sectional view of a semiconductor device according to exemplary embodiments of the present disclosure.

Referring to FIG. 3, semiconductor device according to some exemplary embodiments of the present disclosure may include a base substrate SUB, a first thin-film transistor T1, and a second thin-film transistor T2. Each of the first and second thin-film transistors T1 and T2 may include one of the pixel driving circuits shown in FIG. 2. For example, the first thin-film transistor T1 may correspond to the first thin-film transistor TR1 of FIG. 2, and the second thin-film transistor T2 may correspond to the second thin-film transistor TR2 of FIG. 2. However, other arrangements may be used.

Each of the first and second thin-film transistors T1 and T2 may be disposed on a top surface of the base substrate SUB, and the top surface of the base substrate SUB may be defined by the first direction DR1 and the second direction (e.g., see DR2 in FIG. 1).

The first thin-film transistor T1 may include a first input electrode IE1, a first output electrode OE1, a first control electrode CE1, and a first semiconductor pattern SP1. For example, the first thin-film transistor T1 may include the first input electrode IE1, the first output electrode OE1, the first semiconductor pattern SP1, which is disposed below a first insulating layer IL1, and the first control electrode CE1, which is disposed on the first insulating layer IL1 and below a second insulating layer IL2. The first thin-film transistor T1 may be a driving transistor, which is connected to an organic light emitting diode (e.g., see OLED in FIG. 2), however, other arrangements may be used.

The second thin-film transistor T2 may include a second input electrode IE2, a second output electrode OE2, a second control electrode CE2, and a second semiconductor pattern SP2. For example, the second thin-film transistor T2 may include the second input electrode IE2, the second output electrode OE2, the second semiconductor pattern SP2, which is disposed on the second insulating layer IL2, and the second control electrode CE2, which is disposed on an insulating pattern IP. The insulating pattern IP may be disposed on the second semiconductor pattern SP2 to partially expose the second semiconductor pattern SP2. The second thin-film transistor T2 may serve as a control transistor or a switching transistor that is used to control a switching operation of the pixel $PX_{ij}$. However, other arrangements may be used, and in certain exemplary embodiments, the second thin-film transistor T2 may serve as a driving transistor.

The base substrate SUB may be a layer, film, or plate, on which the first thin-film transistor T1, the second thin-film transistor T2, and the first capacitor CST can be disposed. The base substrate SUB may include a plastic substrate, a glass substrate, a metal substrate, or the like. The plastic substrate may include acrylic resins, methacryl resins, polyisoprene resins, vinyl resins, epoxy resins, urethane resins, cellulose resins, siloxane resins, polyimide resins, polyamide resins, and/or perylene resins.

The first semiconductor pattern SP1, the first control electrode CE1, the second semiconductor pattern SP2, and the second control electrode CE2 may be overlapped with each other, when viewed in a plan view. Hereinafter, the plan view may be taken to be parallel to both of first and second directions DR1 and DR2 or perpendicular to a thickness direction DR3.

When measured in the first direction DR1, a width of the first semiconductor pattern SP1 may be greater than widths of the second semiconductor pattern SP2, the first control electrode CE1, and the second control electrode CE2.

The first semiconductor pattern SP1 may be formed of or may otherwise include a crystalline semiconductor. For example, the first semiconductor pattern SP1 may include a polycrystalline semiconductor material (e.g., poly silicon).

The first semiconductor pattern SP1 may include a first region AR11 and a third region AR13, which are each doped with impurities, and a second region AR12, which is positioned adjacent to, or between, the first and third regions AR11 and AR13. The impurities may contain dopants. The first region AR11 may be coupled to the first input electrode IE1, and the third region AR13 may be coupled to the first output electrode OE1.

The second region AR12 may be disposed between the first region AR11 and the third region AR13 and may be overlapped with the first control electrode CE1, when viewed in a plan view. The second region AR12 may be used as a channel region of the first thin-film transistor T1. The channel region of the first thin-film transistor T1 may include a polycrystalline semiconductor material. Thus, the first thin-film transistor T1 may be used as a driving device with high mobility and high reliability.

The first insulating layer IL1 may be disposed on the first semiconductor pattern SP1. The first insulating layer IL1 may include inorganic materials and/or organic materials. For example, the first insulating layer IL1 may include silicon nitride and/or silicon oxide.

The first insulating layer IL1 may be disposed on the base substrate SUB to cover at least a portion of the first semiconductor pattern SP1. According to some embodiments of the present disclosure, the shape of the first insulating layer IL1 is not necessarily limited to a specific shape and may be variously changed.

The first control electrode CE1 may be disposed on the first insulating layer IL1. The first control electrode CE1 may be overlapped with at least the second region AR12 of the first semiconductor pattern SP1. The first control electrode CE1 may be spaced apart from the first semiconductor pattern SP1 with the first insulating layer IL1 interposed therebetween. The first control electrode CE1 may be used to control flow of electric charge in the second region AR12, which serves as a channel region of a transistor. The first control electrode CE1 may be overlapped with a portion of the first semiconductor pattern SP1 in a plan view.

The second insulating layer IL2 may be disposed on the first control electrode CE1. The second insulating layer IL2 may be disposed on the first insulating layer IL1 to cover the first control electrode CE1. The second insulating layer IL2 may include organic materials and/or inorganic materials.

The second semiconductor pattern SP2 may be disposed on the second insulating layer IL2. The second semiconductor pattern SP2 may include one or more oxide semiconductors. For example, the oxide semiconductor may include zinc oxide, indium oxide, gallium oxide, tin oxide, and/or titanium oxide. In some exemplary embodiments of the present disclosure, the second semiconductor pattern SP2 may include a crystallized oxide semiconductor. The crystallized oxide semiconductor may be disposed to have a vertical directionality.

The second semiconductor pattern SP2 may include a first region AR21 and a third region AR23, which are doped with impurities, and a second region AR22, which is adjacent to the first region AR21 and the third region AR23. The first region AR21 and the third region AR23 may be spaced apart from each other with the second region AR22 interposed therebetween.

FIGS. 4 to 8 illustrate the first and second semiconductor patterns SP1 and SP2.

The second region AR22 may be used as a channel region of the second thin-film transistor T2. In some exemplary embodiments of the present disclosure, a reduced metallic material may be used as the impurities in the second semiconductor pattern SP2. The first region AR21 and the third region AR23 may include a metallic material reduced from the metal oxide of the second region AR22. Accordingly, a leakage current of the second thin-film transistor T2 may be reduced, and thus, the second thin-film transistor T2 can be used as a switching transistor.

The insulating pattern IP may be disposed on the second semiconductor pattern SP2. The insulating pattern IP may include inorganic and/or organic materials. The insulating pattern IP may be disposed to expose a portion of a top surface of the second semiconductor pattern SP2. The insulating pattern IP may be disposed to cover the second region AR22 of the second semiconductor pattern SP2 and to expose the first region AR21 and the third region AR23.

The second control electrode CE2 may be disposed on the insulating pattern IP. The second control electrode CE2 may be overlapped with the insulating pattern IP, when viewed in a plan view. In some exemplary embodiments of the present disclosure, the insulating pattern IP may be disposed to have a side surface that is aligned to a side surface of the second control electrode CE2, and the side surfaces of the insulating pattern IP and the second control electrode CE2 may form a single vertical line. The border between the first region AR21 and the second region AR22 and the border between the second region AR22 and the third region AR23 may be aligned to the side surface of the insulating pattern IP. The insulating pattern IP and the second control electrode CE2 may have the same shape as one another, when viewed in a plan view. The second control electrode CE2 may be in contact with the insulating pattern IP.

Scan lines (e.g., see SL1-SLn in FIG. 1) may be disposed at the same level or layer as the second control electrode CE2. However, other configurations may be used, and the scan lines SL1-SLn may be disposed at several (e.g., at least two different) levels or layers.

In some exemplary embodiments of the present disclosure, the semiconductor device may further include a third insulating layer IL3 disposed on the second insulating layer IL2. The third insulating layer IL3 may be disposed on the second insulating layer IL2 to cover the second semiconductor pattern SP2, the insulating pattern IP, and the second control electrode CE2. The third insulating layer IL3 may include inorganic and/or organic materials.

Each of the first input electrode IE1, the first output electrode OE1, the second input electrode IE2, and the second output electrode OE2 may include a portion that is disposed above the third insulating layer IL3.

When viewed in a plan view, the second input electrode IE2 and the second output electrode OE2 may be disposed between the first input electrode IE1 and the first output electrode OE1. When viewed in a plan view, the second input electrode IE2 and the second output electrode OE2 may be spaced apart from each other in the first direction DR1, and the second input electrode IE2 and the second output electrode OE2 may be disposed between the first input electrode IE1 and the first output electrode OE1.

The first input electrode IE1 and the first output electrode OE1 may be disposed in a first through hole OP and a second through hole OP2, respectively, which are formed to penetrate the first to third insulating layers IL1, IL2, and IL3 and are spaced apart from each other, and may be in contact with the first semiconductor pattern SP1 through the first and second through holes OP1 and OP2. For example, the first input electrode IE1 may be in contact with the first region AR11 of the first semiconductor pattern SP1 through the first through hole OP1, and the first output electrode OE1 may be in contact with the third region AR13 of the first semiconductor pattern SP1 through the second through hole OP2.

The second input electrode IE2 and the second output electrode OE2 may be disposed in a third through hole OP3 and a fourth through hole OP4, respectively, which are formed to penetrate the third insulating layer IL3 and are spaced apart from each other, and may be in contact with the second semiconductor pattern SP2 through the third and fourth through holes OP3 and OP4. For example, the second input electrode IE2 may be in contact with the first region AR21 of the second semiconductor pattern SP2 through the third through hole OP3, and the second output electrode OE2 may be in contact with the third region AR23 of the second semiconductor pattern SP2 through the fourth through hole OP4.

The data lines DL1-DLm may be disposed at the same level or layer as the second input electrode IE2 and the second output electrode OE2. Accordingly, the data lines DL1-DLm may be disposed to be in direct contact with a top surface of the third insulating layer IL3, but other configurations may be used.

The first control electrode CE1 may be used to receive a first control signal, and the second control electrode CE2 may be used to receive a second control signal. The second control signal may be independent of the first control signal. For example, the first and second thin-film transistors T1 and T2 may be configured to receive signals in an independent manner.

Figure 4:
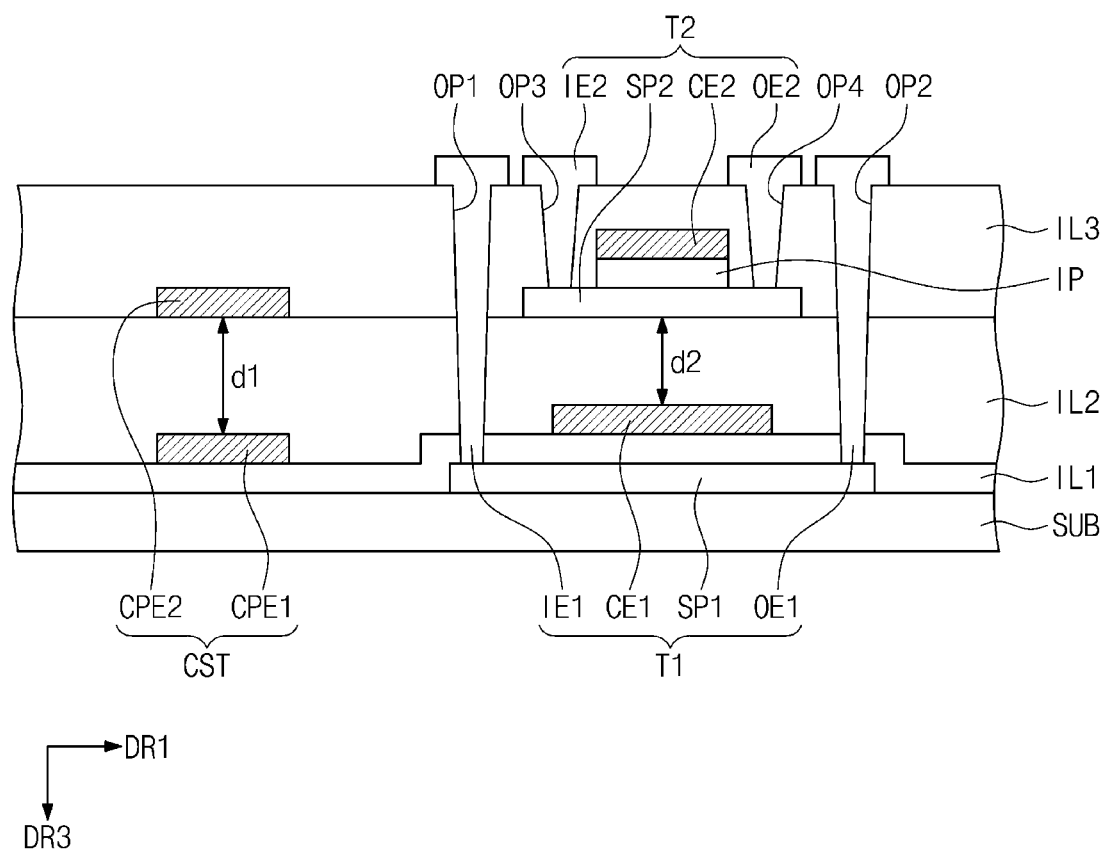
FIG. 4 is a cross-sectional view illustrating a semiconductor device according to exemplary embodiments of the present disclosure.

FIG. 4 is a cross-sectional view of a semiconductor device according to some exemplary embodiments of the present disclosure.

Referring to FIG. 4, a semiconductor device according to some exemplary embodiments of the present disclosure may further include the first capacitor CST. In some exemplary embodiments of the present disclosure, the first capacitor CST may correspond to the capacitor CST (e.g., see FIG. 2) of FIG. 2, but other configurations may be used. The first capacitor CST may be disposed on the base substrate SUB. The first capacitor CST may include a first electrode CPE1 and a second electrode CPE2, which is disposed on the first electrode CPE1. The first electrode CPE1 may be disposed at the same level or layer as the first control electrode CE1, and the second electrode CPE2 may be disposed at the same level or layer as the second semiconductor pattern SP2.

The second insulating layer IL2 may be disposed between the first electrode CPE1 and the second electrode CPE2. For example, the first electrode CPE1 may be spaced apart from the second electrode CPE2 with the second insulating layer IL2 interposed therebetween. A portion of the second insulating layer IL2 disposed between the first electrode CPE1 and the second electrode CPE2 may serve as a dielectric layer of the first capacitor CST. The first electrode CPE1 and the second electrode CPE2 may be spaced apart from each other with the second insulating layer IL2 interposed therebetween in a vertical direction, may be overlapped with each other in a plan view, and may be used to produce an electric field therebetween. Thus, the electric field may be determined by at least one of thickness or material of the second insulating layer IL2.

A thickness d1 of the second insulating layer IL2 disposed between the first electrode CPE1 and the second electrode CPE2 may be larger than a thickness d2 of the second insulating layer IL2 disposed between the first control electrode CE1 and the second semiconductor pattern SP2. The thicknesses d1 and d2 may be lengths of the second insulating layer IL2 measured in a vertical distance (e.g., the third direction DR3).

Figure 5:
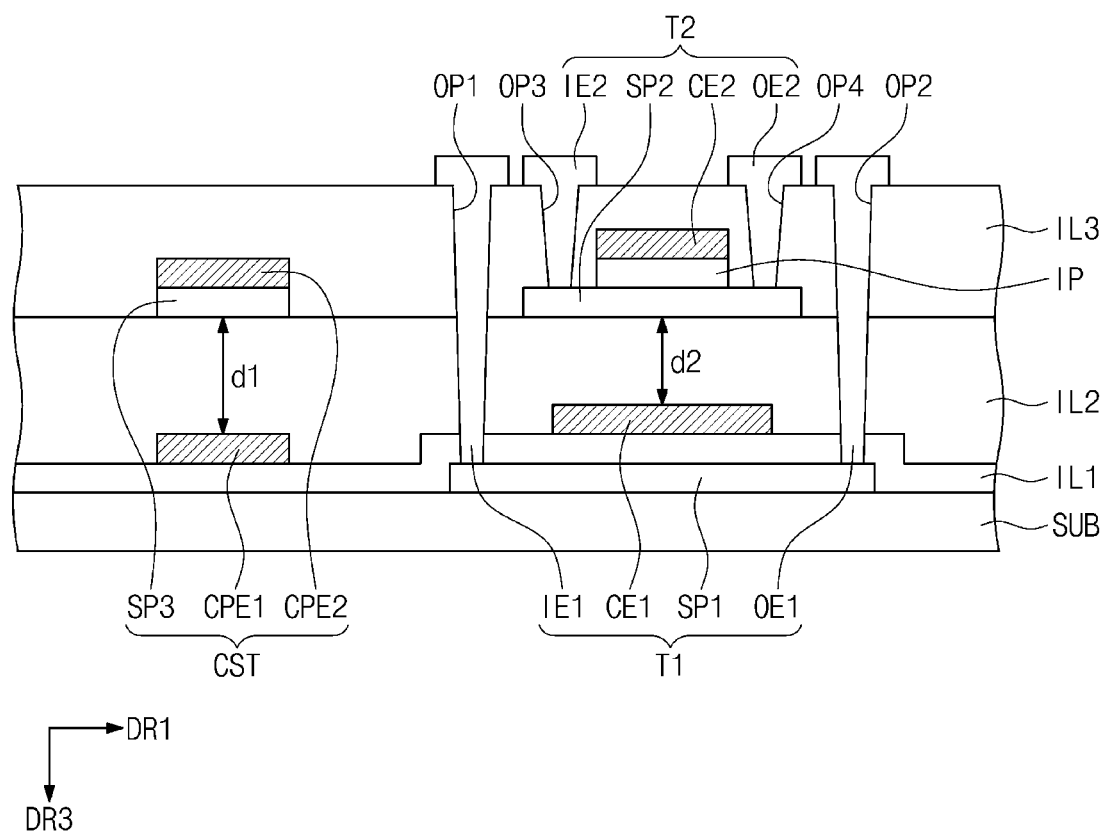
FIG. 5 is a cross-sectional view illustrating a semiconductor device according to exemplary embodiments of the present disclosure.

FIG. 5 is a cross-sectional view of a semiconductor device according to some embodiments of the present disclosure.

Referring to FIG. 5, the first capacitor CST may further include a third semiconductor pattern SP3, which is disposed between the second insulating layer IL2 and the second electrode CPE2. The third semiconductor pattern SP3 may include an oxide semiconductor material. For example, the third semiconductor pattern SP3 may include the same oxide semiconductor as that of the second semiconductor pattern SP2. The third semiconductor pattern SP3 may be in contact with the second electrode CPE2 and may be spaced apart from the first electrode CPE1. By changing conduction characteristics of the third semiconductor pattern SP3, the capacitance of the first capacitor CST may be controlled.

The second electrode CPE2 may be disposed to have a side surface that is aligned to a side surface of the third semiconductor pattern SP3, and in certain embodiments, the side surfaces of the second electrode CPE2 and the third semiconductor pattern SP3 may form a single vertical line. The second electrode CPE2 and the third semiconductor pattern SP3 may be overlapped with each other, when viewed in a plan view. The second electrode CPE2 and the third semiconductor pattern SP3 may have the same shape as one another, when viewed in a plan view.

Figure 6:
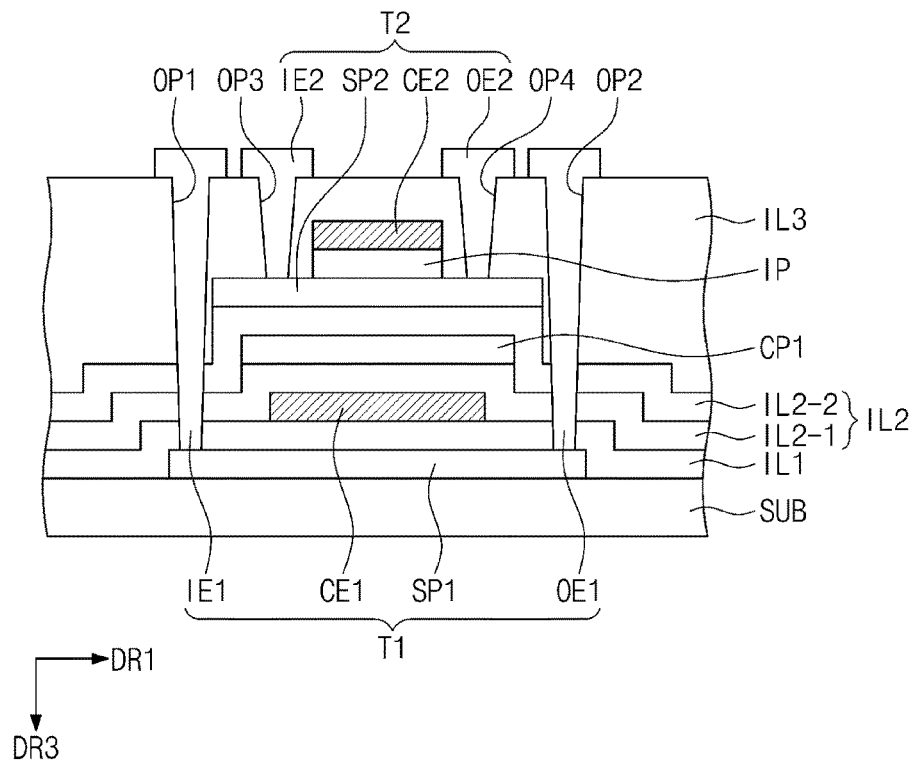
FIG. 6 is a cross-sectional view illustrating a semiconductor device according to exemplary embodiments of the present disclosure.

FIG. 6 is a cross-sectional view of a semiconductor device according to some exemplary embodiments of the present disclosure.

Referring to FIG. 6, a semiconductor device, according to some exemplary embodiments of the present disclosure, may further include a first conductive pattern CP1 disposed between the first control electrode CE1 and the second semiconductor pattern SP2. In this case, the second insulating layer IL2 may include a first sub-insulating layer IL2-1, which is disposed below the first conductive pattern CP1 to cover the first control electrode CE1, and a second sub-insulating layer IL2-2, which is disposed on the first conductive pattern CP1 to cover the first conductive pattern CP1. The first semiconductor pattern SP1, the first control electrode CE1, the first conductive pattern CP1, the second semiconductor pattern SP2, the insulating pattern IP, and the second control electrode CE2 may be overlapped with each other in a plan view.

The first conductive pattern CP1 may be used for various purposes. For example, a second capacitor of a semiconductor device may include the first conductive pattern CP1, in conjunction with the first control electrode CE1. In this case, the first control electrode CE1 may serve as not only a part of the first thin-film transistor T1 but also an electrode of the second capacitor. Furthermore, in this case, the afore-described first capacitor CST (e.g., see FIG. 4) might not be disposed in the semiconductor device, however, alternative configurations may be used. For example, in the semiconductor device, the first capacitor CST of FIG. 4 may be disposed to be spaced apart from the second capacitor or to be connected to the second capacitor. In some exemplary embodiments of the present disclosure, the first control electrode CE1 may be electrically connected to the first electrode CPE1, and the first conductive pattern CP1 may be electrically connected to the second control electrode CE2.

In some exemplary embodiments of the present disclosure, the first conductive pattern CP1 may be configured to receive a ground signal, and accordingly, interference may be prevented from occurring between the first and second thin-film transistors T1 and T2.

In some exemplary embodiments of the present disclosure, the first conductive pattern CP1 and the second control electrode CE2 may be configured to receive the same signal. In this case, the second thin-film transistor T2 may include two control electrodes CP1 and CE2, thereby forming a so-called 'double gate structure'. The first conductive pattern CP1 and the second control electrode CE2 may be electrically connected to each other. The first conductive pattern CP1 and the second control electrode CE2 may be electrically connected to each other through a hole, which is formed to penetrate the third insulating layer IL3 and the second sub-insulating layer IL2-2.

Figure 7:
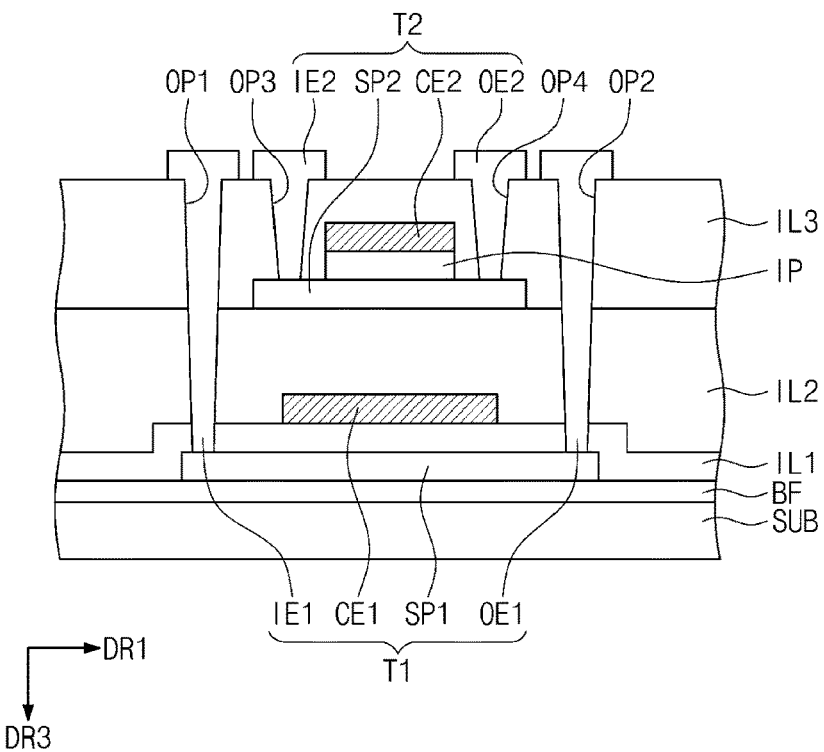
FIG. 7 is a cross-sectional view illustrating a semiconductor device according to exemplary embodiments of the present disclosure.

FIG. 7 is a cross-sectional view of a semiconductor device according to exemplary embodiments of the present disclosure.

Referring to FIG. 7, a semiconductor device may further include a buffer layer BF disposed between the base substrate SUB and the first semiconductor pattern SP L. However, the present disclosure is not limited thereto, and the structure of the semiconductor device may be variously changed depending on its kind. The buffer layer BF may be used to enhance a bonding strength between the base substrate SUB and the first semiconductor pattern SP1. The buffer layer BF may include inorganic and/or organic materials. A barrier layer preventing foreign substance from the outside may be further disposed on the top surface of the base substrate SUB. In certain embodiments, each of the buffer layer BF and the barrier layer may be provided or omitted, in consideration of the kind or purpose of the semiconductor device.

Figure 8:
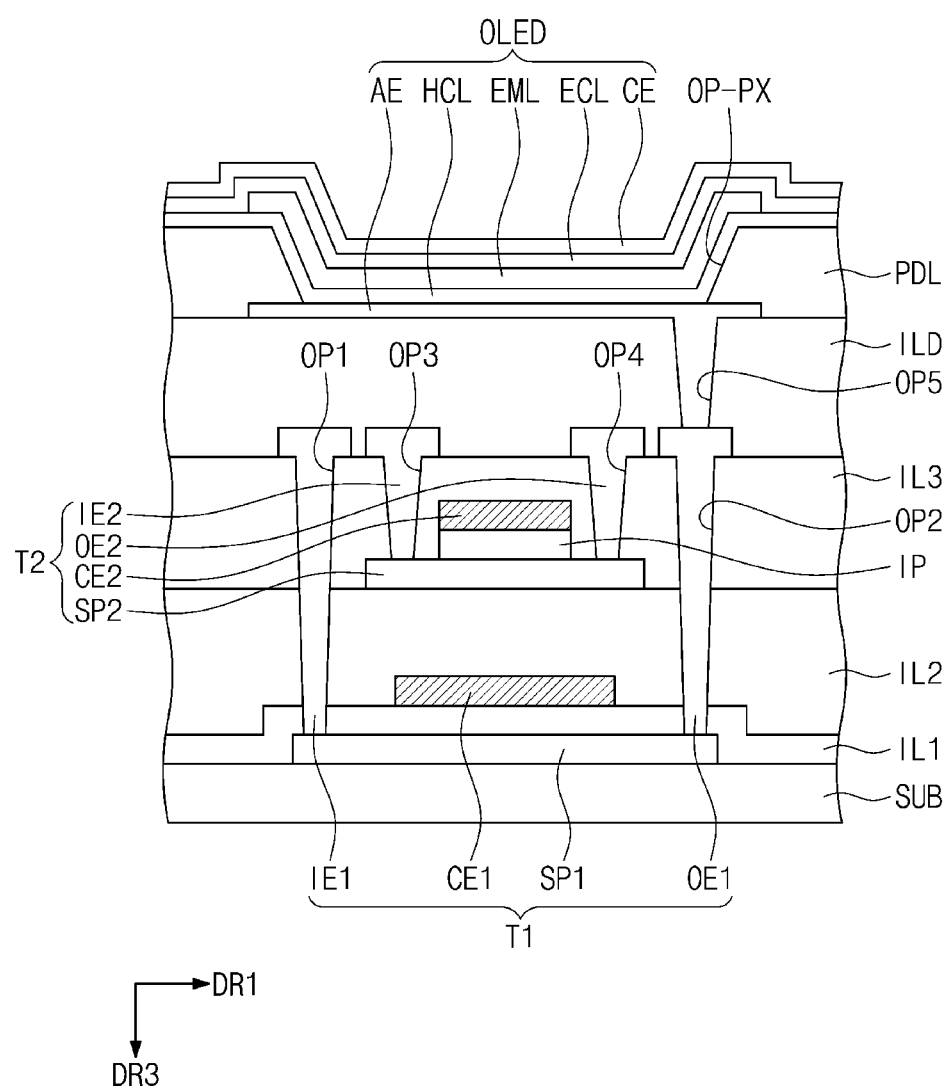
FIG. 8 is a cross-sectional view illustrating a semiconductor device according to exemplary embodiments of the present disclosure.

FIG. 8 is a cross-sectional view of a semiconductor device according to some exemplary embodiments of the present disclosure.

Referring to FIG. 8, as described above, a semiconductor device may further include a light-emitting diode (e.g., the organic light emitting diode OLED). The organic light emitting diode OLED may be connected to the first thin-film transistor T1.

The organic light emitting diode OLED may include an anode AE, a cathode CE, and an organic layer, which is interposed between the anode AE and the cathode CE. The organic layer may include a first charge control layer HCL, a light emitting layer EML, a second charge control layer ECL.

The semiconductor device may further include an interlayered insulating layer ILD disposed on the third insulating layer IL3. The interlayered insulating layer ILD may include inorganic and/or organic materials. The interlayered insulating layer ILD may be disposed to have a fifth through hole OP5 penetrating the interlayered insulating layer ILD. The fifth through hole OP5 may be overlapped with the first output electrode OE1, when viewed in a plan view.

The anode AE may be disposed on the interlayered insulating layer ILD. The anode AE may be coupled to the first output electrode OE1 of the first thin-film transistor T1 via the fifth through hole OP5.

A pixel defining layer PDL may be disposed on the interlayered insulating layer ILD. The pixel defining layer PDL may include an inorganic layer and/or an organic layer. An opening OP-PX may be defined in the pixel defining layer PDL. The opening OP-PX may be disposed to expose at least a portion of the anode AE.

The first charge control layer HCL, the light emitting layer EML, the second charge control layer ECL, and the cathode CE may be sequentially stacked on the anode AE. The light emitting layer EML may be a light-emitting pattern, which is overlapped with the opening OP-PX. The first charge control layer HCL may be used as a hole transport region, and the second charge control layer ECL may be used as an electron transport region. In the organic light emitting diode OLED, the light emitting layer EML may be configured to generate light using a difference in voltage between the anode AE and the cathode CE. A display device according to exemplary embodiments of the present disclosure may further include organic and/or inorganic layers disposed on the cathode CE.

In the semiconductor device described with reference to FIGS. 1 to 8, the first thin-film transistor T1 containing a crystalline semiconductor and the second thin-film transistor T2 containing an oxide semiconductor may be vertically stacked. Accordingly, a semiconductor device with high integration density and high resolution may be realized. In addition, since the first and second thin-film transistors T1 and T2 are configured to have respective control electrodes, operations thereof can be controlled in an independent manner. Furthermore, each of the first and second thin-film transistors T1 and T2 may have a so-called 'top-gate structure' which may increase resolution, compared with the bottom-gate structure. However, the present disclosure is not limited to the examples described with reference to FIGS. 1 to 8, and other configurations maybe used.

Hereinafter, a semiconductor device according to exemplary embodiments of the present disclosure will be described with reference to FIGS. 9 to 12. For concise description, an element previously described with reference to FIGS. 1 to 8 may be identified by a similar or identical reference number without repeating an overlapping description thereof and it may be assumed that such elements are at least similar to the corresponding elements previously described.

Figure 9:
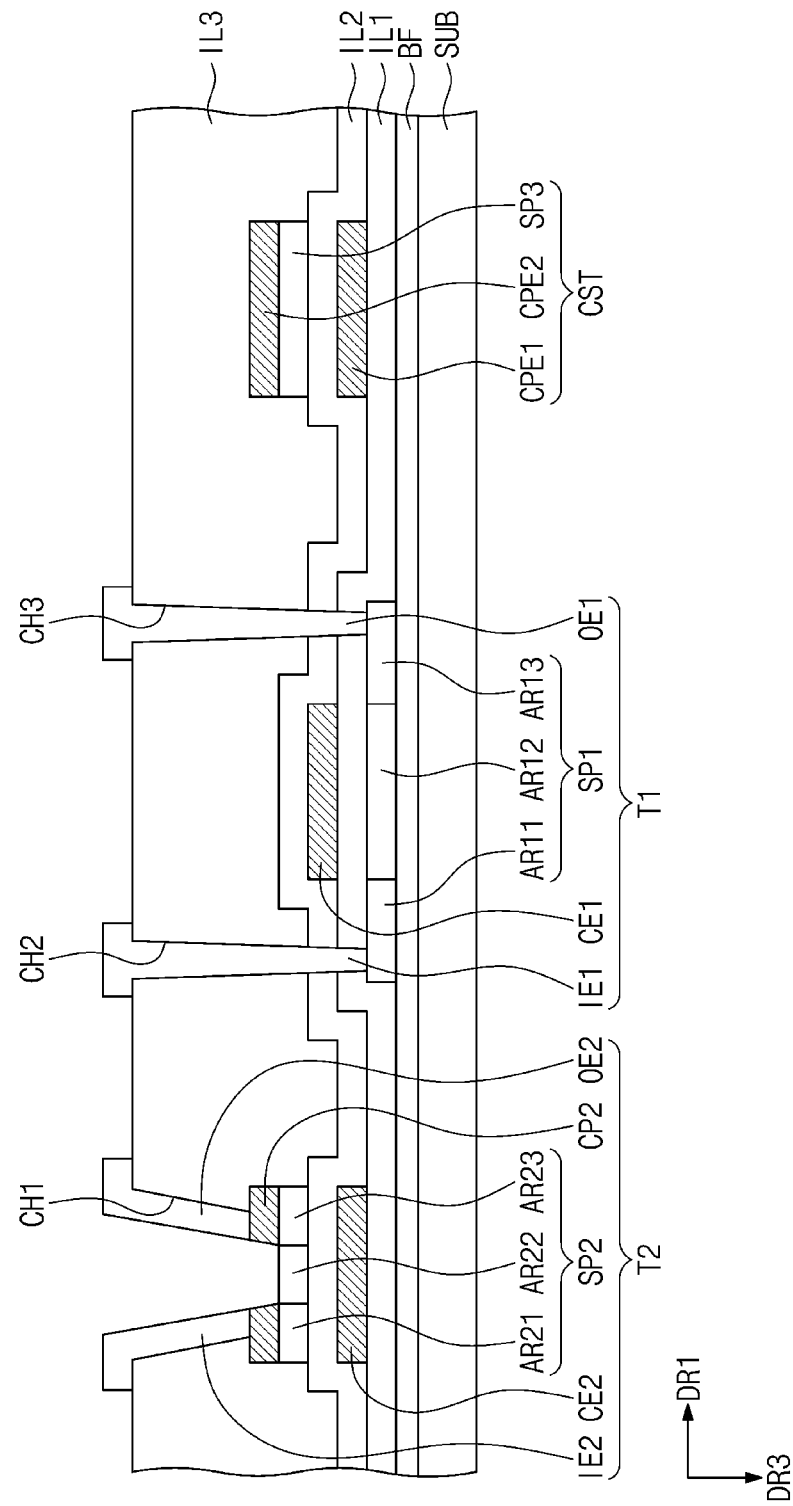
FIG. 9 is a cross-sectional view illustrating a semiconductor device according to exemplary embodiments of the present disclosure.

FIG. 9 is a cross-sectional view of a semiconductor device according to exemplary embodiments of the present disclosure.

Referring to FIG. 9, a semiconductor device may include the base substrate SUB, the first thin-film transistor T1, the second thin-film transistor T2, and the first capacitor CST. The first and second thin-film transistors T1 and T2 and the first capacitor CST may be disposed on the base substrate SUB.

The first thin-film transistor T1 may include the first input electrode IE1, the first output electrode OE1, the first semiconductor pattern SP1 containing a crystalline semiconductor material, and the first control electrode CE1 on the first semiconductor pattern SP1. For example, the first semiconductor pattern SP1 may include a polycrystalline semiconductor material (e.g., poly silicon). As described above, the first semiconductor pattern SP1 may include the first region AR11, the second region AR12, and the third region AR13, but a detailed description thereof will be omitted, for the sake of brevity and it may be assumed that such elements are at least similar to corresponding elements that have already been described.

The second thin-film transistor T2 may include the second input electrode IE2, the second output electrode OE2, the second control electrode CE2, the second semiconductor pattern SP2 containing an oxide semiconductor, and a second conductive pattern CP2, which is disposed on the second semiconductor pattern SP2 to expose a portion of the second semiconductor pattern SP2. The second control electrode CE2 may be disposed below the second semiconductor pattern SP2. For example, the first thin-film transistor T1 may have a so-called 'top-gate structure', and the second thin-film transistor T2 may have a so-called 'bottom-gate structure'.

The second semiconductor pattern SP2 may include a first region AR21 and a third region AR23, which are doped with impurities, and a second region AR22, which is adjacent to the first region AR21 and the third region AR23. The first region AR21 and the third region AR23 may be spaced apart from each other with the second region AR22 interposed therebetween. The second region AR22 may be used as a channel region of the second thin-film transistor T2.

Figure 10:
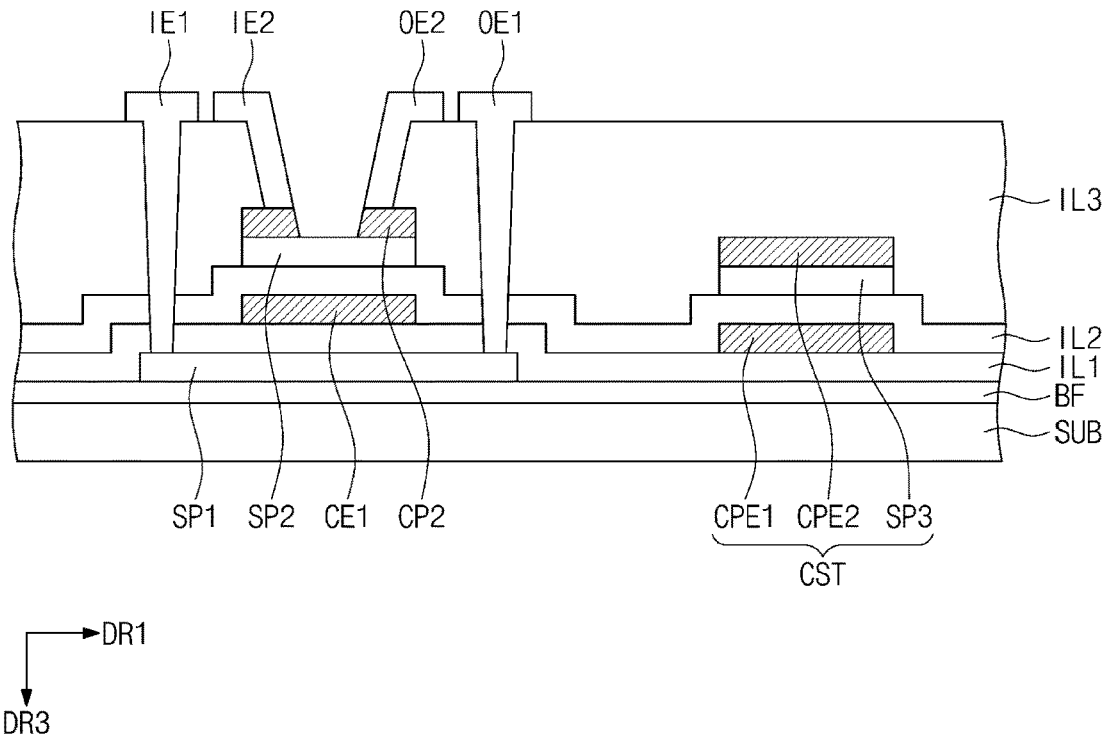
FIG. 10 is a cross-sectional view illustrating a semiconductor device according to exemplary embodiments of the present disclosure.
Figure 11:
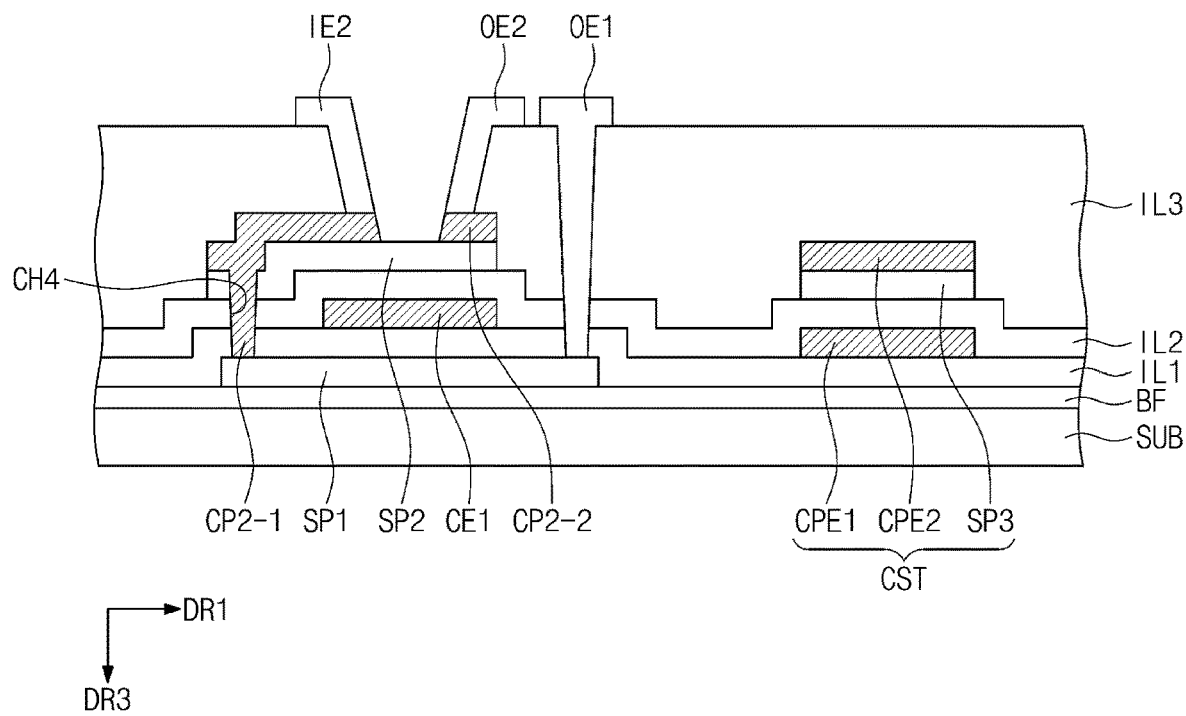
FIG. 11 is a cross-sectional view illustrating a semiconductor device according to exemplary embodiments of the present disclosure.
Figure 12:
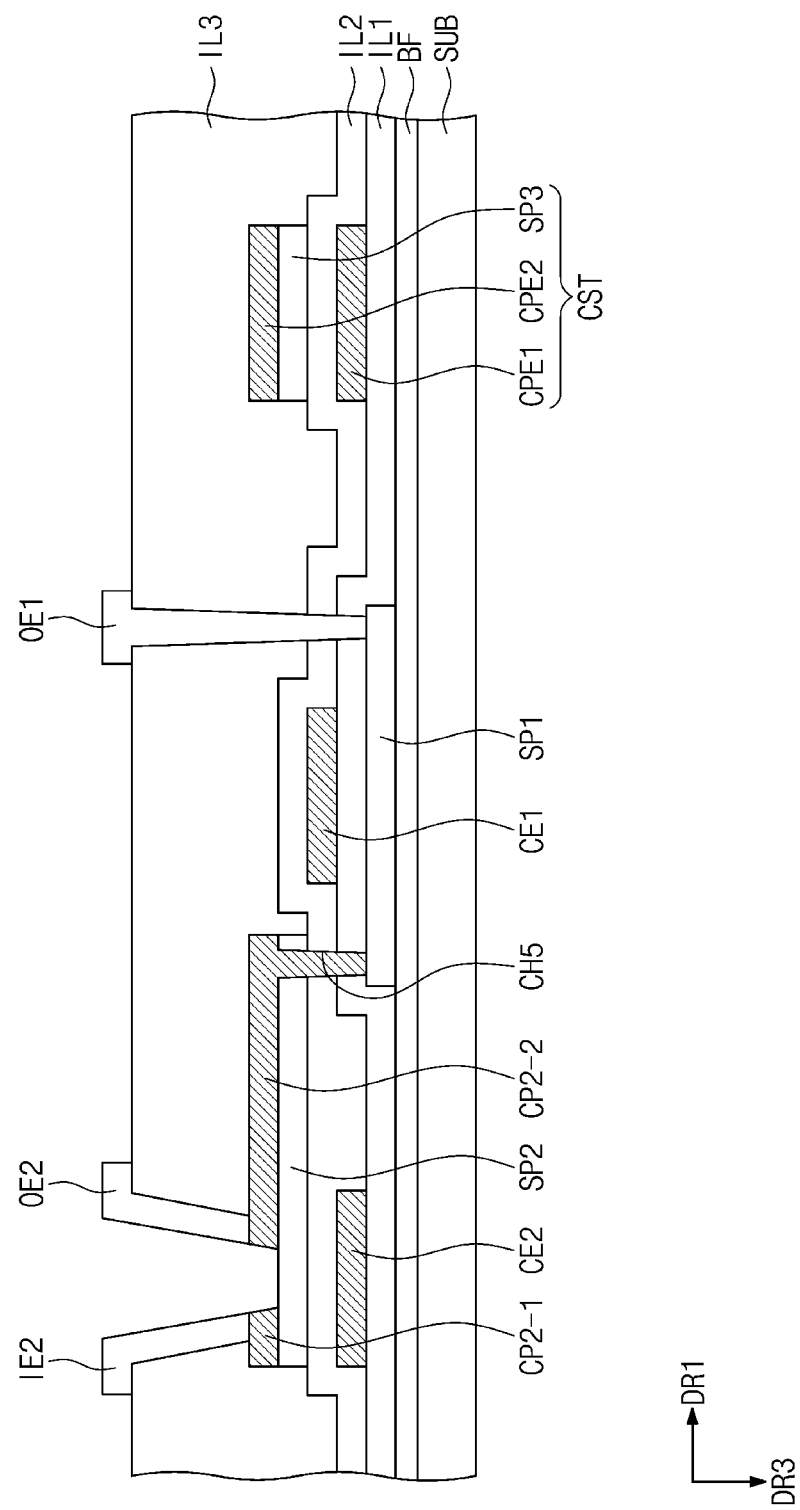
FIG. 12 is a cross-sectional view illustrating a semiconductor device according to exemplary embodiments of the present disclosure.

Hereinafter, as shown in FIGS. 10 to 12, the first and second semiconductor patterns SP1 and SP2 are illustrated.

Referring back to FIG. 9, the second conductive pattern CP2 may be in contact with the second semiconductor pattern SP2. The second conductive pattern CP2 may be disposed on a portion of the second semiconductor pattern SP2, thereby partially exposing a top surface of the second semiconductor pattern SP2. The second conductive pattern CP2 may be disposed to expose the second region AR22 serving as the channel region and to cover the first region AR21 and the third region AR23.

The second conductive pattern CP2 may be disposed to have a side surface that is aligned to a side surface of the second semiconductor pattern SP2, and in certain embodiments, the side surfaces of the second conductive pattern CP2 and the second semiconductor pattern SP2 may form a single vertical line. In some exemplary embodiments of the present disclosure, the second conductive pattern CP2 and the second semiconductor pattern SP2 may have shapes different from each other, when viewed in a plan view.

The second conductive pattern CP2 may be disposed between the second semiconductor pattern SP2 and the second input electrode IE2 and between the second semiconductor pattern SP2 and the second output electrode OE2. The second conductive pattern CP2, which is disposed between the second semiconductor pattern SP2 and the second input electrode IE2, may be in direct contact with each of the second semiconductor pattern SP2 and the second input electrode IE2. The second conductive pattern CP2, which is disposed between the second semiconductor pattern SP2 and the second output electrode OE2, may be in contact with each of the second semiconductor pattern SP2 and the second output electrode OE2. The second input electrode IE2 and the second conductive pattern CP2, which are in contact with each other, may serve as an input electrode of the second thin-film transistor T2, and the second output electrode OE2 and the second conductive pattern CP2, which are in contact with each other, may serve as an output electrode of the second thin-film transistor T2.

The first capacitor CST may include the first electrode CPE1, the second electrode CPE2 on the first electrode CPE1, and the third semiconductor pattern SP3 between the first and second electrodes CPE1 and CPE2. The third semiconductor pattern SP3 may be in contact with the second electrode CPE2 and may be spaced apart from the first electrode CPE1. The third semiconductor pattern SP3 may include an oxide semiconductor material. For example, the third semiconductor pattern SP3 may include the same oxide semiconductor material as that of the second semiconductor pattern SP2. By changing conduction characteristics of the third semiconductor pattern SP3, the capacitance of the first capacitor CST may be controlled.

The second electrode CPE2 may be disposed to have a side surface that is aligned to a side surface of the third semiconductor pattern SP3, and in some exemplary embodiments of the present disclosure, the side surfaces of the second electrode CPE2 and the third semiconductor pattern SP3 may form a single vertical line. The second electrode CPE2 and the third semiconductor pattern SP3 may be overlapped with each other, when viewed in a plan view. The second electrode CPE2 and the third semiconductor pattern SP3 may have the same shape as one another, when viewed in a plan view.

The first control electrode CE1, the second control electrode CE2, and the first electrode CPE1 may be disposed at the same level or layer. The second semiconductor pattern SP2 and the third semiconductor pattern SP3 may be disposed at the same level or layer. The second conductive pattern CP2 and the second electrode CPE2 may be disposed at the same level or layer.

In some exemplary embodiments of the present disclosure, the semiconductor device may include a plurality of insulating layers. The plurality of insulating layers may include the first to third insulating layers IL1, IL2, and IL3 disposed on the base substrate SUB. The semiconductor device may further include the buffer layer BF that is disposed between the base substrate SUB and the first semiconductor pattern SP1.

The first to third insulating layers IL1, IL2, and IL3 may be sequentially stacked on the base substrate SUB. The first insulating layer IL1 may be disposed on the base substrate SUB to cover the first semiconductor pattern SP1. The second insulating layer IL2 may be disposed on the first insulating layer IL1 to cover the first control electrode CE1, the second control electrode CE2, and the first electrode CPE1. The third insulating layer IL3 may be disposed on the second insulating layer IL2.

The third insulating layer IL3 may be disposed to have a first contact hole CH1. Each of the second input electrode IE2 and the second output electrode OE2 may be in contact with the second conductive pattern CP2 through the first contact hole CH1. The first contact hole CH1 may include a region, which is not filled with the second input electrode IE2 and the second output electrode OE2 and is formed to expose the second region AR22 of the second semiconductor pattern SP2.

The first input electrode IE1 and the first output electrode OE1 may be in contact with the first semiconductor pattern SP1 through a second contact hole CH2 and a third contact hole CH3, respectively, which are formed to penetrate the first to third insulating layers IL1, IL2, and IL3 and are spaced apart from each other. For example, the first input electrode IE1 may be in contact with the first region AR11 of the first semiconductor pattern SP1 through the second contact hole CH2, and the first output electrode OE1 may be in contact with the third region AR113 of the first semiconductor pattern SP1 through the third contact hole CH3.

FIG. 10 is a cross-sectional view of a semiconductor device according to some exemplary embodiments of the present disclosure.

Referring to FIG. 10, the second semiconductor pattern SP2 may be disposed on the first semiconductor pattern SP1, and the first control electrode CE1 and the second control electrode CE2 may be disposed to serve as a single electrode. In addition, the first semiconductor pattern SP1, the first control electrode CE1, and the second semiconductor pattern SP2 may be overlapped with each other, when viewed in a plan view. In this case, an integration density and resolution of a semiconductor device may be increased.

In a plan view, the first contact hole CH1 may be disposed between the second contact hole CH2 and the third contact hole CH3, but the present disclosure is not limited thereto. In some exemplary embodiments of the present disclosure, the first contact hole CH1, the second contact hole CH2, and the third contact hole CH3 may be spaced apart from each other in the first direction DR1, as shown in FIG. 9.

FIG. 11 is a cross-sectional view of a semiconductor device according to some exemplary embodiments of the present disclosure.

Referring to FIGS. 9 and 11, the second conductive pattern CP2 may include a first sub-pattern CP2-1, which is disposed between the second semiconductor pattern SP2 and the second input electrode IE2, and a second sub-pattern CP2-2, which is disposed between the second semiconductor pattern SP2 and the second output electrode OE2. The first sub-pattern CP2-1 may extend in a downward direction and may be in contact with the first semiconductor pattern SP1 through a fourth contact hole CH4, which penetrates a portion of the third insulating layer IL3, the second insulating layer IL2, and the first insulating layer IL1. A portion of the first sub-pattern CP2-1 may be in contact with a side surface of the second semiconductor pattern SP2 through the fourth contact hole CH4, but the present disclosure is not limited thereto and other configurations may be used. For example, the fourth contact hole CH4 may be disposed to penetrate the second semiconductor pattern SP2, the second insulating layer IL2, and the first insulating layer IL1, and in this case, the first sub-pattern CP2-1 may penetrate at least a portion of the second semiconductor pattern SP2.

In the case where a connection electrode is needed to connect the first and second thin-film transistors T1 and T2 to each other, the first sub-pattern CP2-1 extending in the downward direction may be used as the connection electrode, and this may increase an integration density and resolution of a semiconductor device. The first and second thin-film transistors T1 and T2 may be connected to each other through the first sub-pattern CP2-1. In both of the first and second thin-film transistors T1 and T2, the first sub-pattern CP2-1 may be used as an input electrode.

FIG. 12 is a cross-sectional view of a semiconductor device according to some exemplary embodiments of the present disclosure.

Referring to FIGS. 9 and 12, when viewed in a plan view, a portion of the first semiconductor pattern SP1 may be overlapped with a portion of the second semiconductor pattern SP2, and the second control electrode CE2 might not be overlapped with the first semiconductor pattern SP1.

As described above, the second conductive pattern CP2 may include the first sub-pattern CP2-1 and the second sub-pattern CP2-2. The second sub-pattern CP2-2 may extend in a downward direction and may be in contact with a portion of the first semiconductor pattern SP1 through a fifth contact hole CH5, and here, the fifth contact hole CH5 may be disposed to penetrate a portion of the third insulating layer IL3, the second insulating layer IL2, and the first insulating layer IL1. A portion of the second sub-pattern CP2-2 may be in contact with a side surface of the second semiconductor pattern SP2 through the fifth contact hole CH5, but the present disclosure is not limited thereto and other configurations may be used. For example, the fifth contact hole CH5 may be disposed to penetrate the second semiconductor pattern SP2, the second insulating layer IL2, and the first insulating layer IL1, and in this case, the second sub-pattern CP2-2 may penetrate at least a portion of the second semiconductor pattern SP2.

In the case where a connection electrode is needed to connect the first and second thin-film transistors T1 and T2 to each other, the second sub-pattern CP2-2 extending in the downward direction may be used as the connection electrode, and this may increase an integration density and resolution of a semiconductor device. The first and second thin-film transistors T1 and T2 may be connected to each other through the second sub-pattern CP2-2. The second sub-pattern CP2-2 may serve not only as an output electrode of the first thin-film transistor T1, but also as an input electrode of the second thin-film transistor T2.

Hereinafter, a method of fabricating a semiconductor device, according to some embodiments of the present disclosure, will be described with reference to FIGS. 13 and 14A to 14K. Overlapping description of an element or step previously described with reference to FIGS. 1 to 8 may be omitted, for brevity's sake and it is to be understood that elements not described with respect to these figures may be at least similar to corresponding elements that have previously been described.

Figure 13:
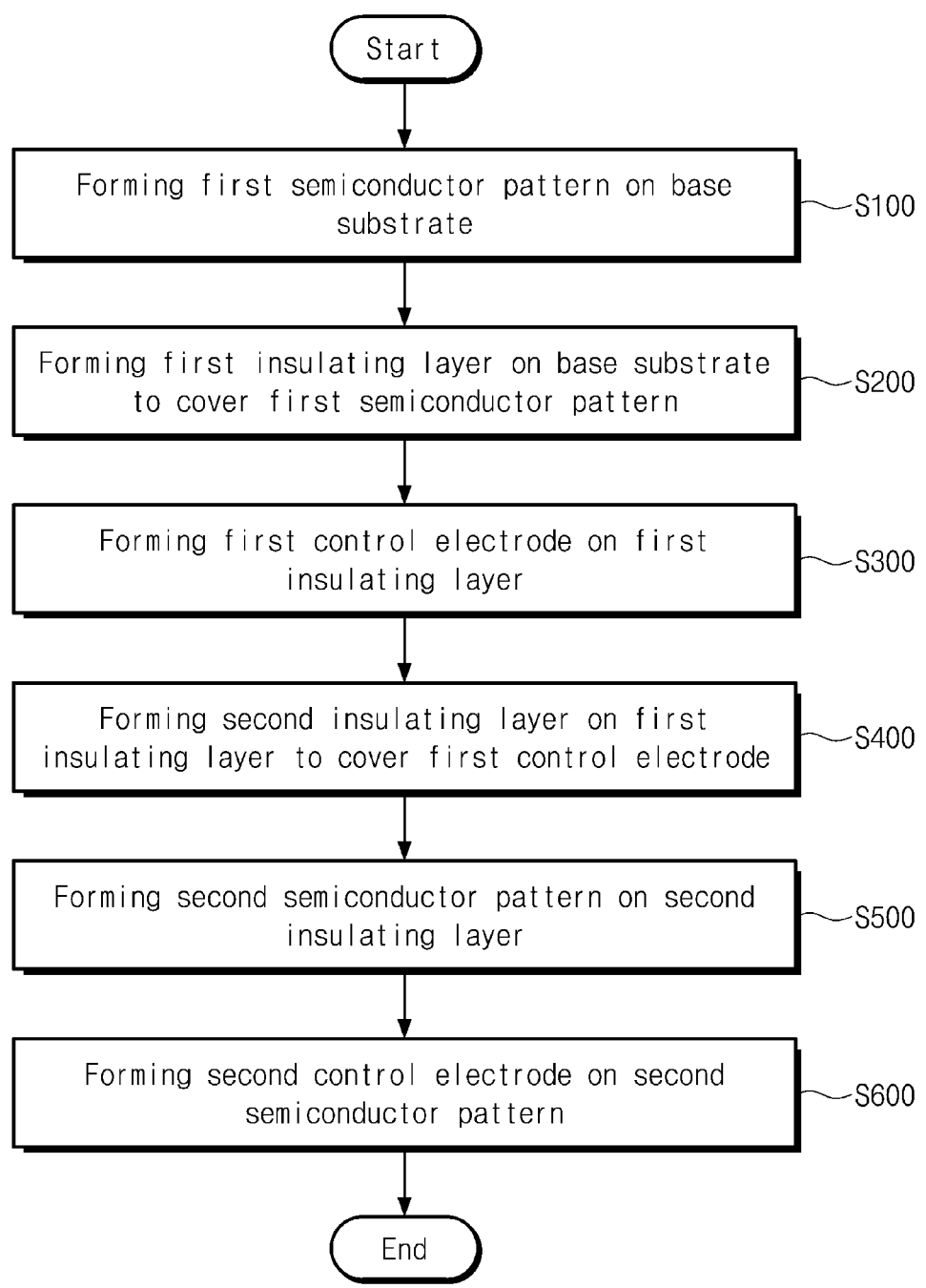
FIG. 13 is a flow chart illustrating a method of fabricating a semiconductor device, according to exemplary embodiments of the present disclosure.

FIG. 13 is a flow chart schematically illustrating a method of fabricating a semiconductor device, according to some exemplary embodiments of the present disclosure. FIGS. 14A to 14K are cross-sectional views sequentially illustrating process steps in a process of fabricating a semiconductor device according to some exemplary embodiments of the present disclosure.

Referring to FIGS. 2 to 8 and 13, a method of fabricating a semiconductor device according to some exemplary embodiments of the present disclosure may include may include forming the first semiconductor pattern SP1, in which a crystalline semiconductor material is contained, on the base substrate SUB (in S100). The first insulating layer IL1 may be formed on the base substrate SUB to cover the first semiconductor pattern SP1 (in S200). The first control electrode CE1 may be formed on the first insulating layer IL1 to be overlapped with the first semiconductor pattern SP1 in a plan view (in S300). The second insulating layer IL2 may be formed on the first insulating layer IL1 to cover the first control electrode CE1 (in S400). The second semiconductor pattern SP2, in which an oxide semiconductor material is contained, may be formed on the second insulating layer IL2 to be overlapped with the first semiconductor pattern SP1 and the first control electrode CE1 in a plan view (in S500). The second control electrode CE2 may be formed on the second semiconductor pattern SP2 to be overlapped with the first semiconductor pattern SP1, the first control electrode CE1, and the second semiconductor pattern SP2 in a plan view (in S600).

The process sequence to fabricate a semiconductor device is not limited to the example illustrated in FIG. 13. For example, in certain embodiments, the forming of the first semiconductor pattern SP1 (in S100) may include forming an initial first semiconductor pattern (e.g., see SP1-A of FIG. 14A), forming an initial first insulating layer (e.g., see IL1-A of FIG. 14B) on the initial first semiconductor pattern (in S200), and performing a doping process. Hereinafter, the fabrication method according to some exemplary embodiments of the present disclosure will be described in more detail with reference to FIGS. 14A to 14K.

Figure 14A:
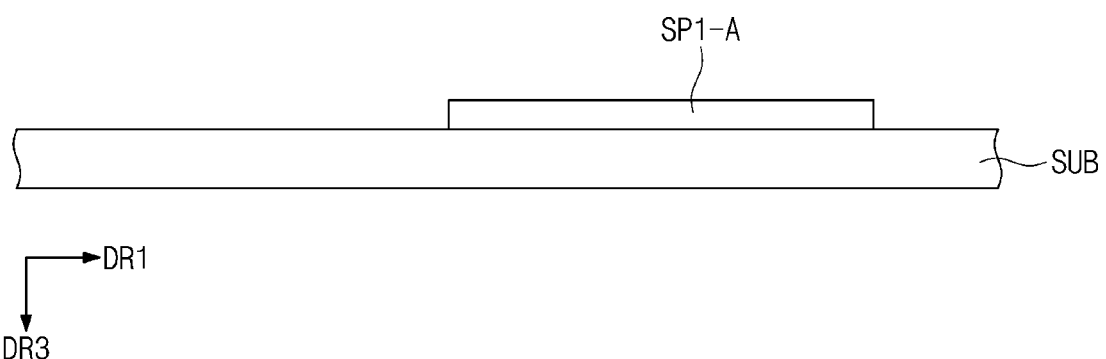

As shown in FIG. 14A, an initial first semiconductor pattern SP1-A may be formed on the base substrate SUB. The formation of the initial first semiconductor pattern SP1-A may include forming a layer, in which a crystalline semiconductor material is contained, on the base substrate SUB and patterning the layer. In certain exemplary embodiments, the formation of the initial first semiconductor pattern SP1-A may include forming a semiconductor layer and crystallizing the semiconductor layer.

The buffer layer BF may be additionally formed on the base substrate SUB, before the formation of the initial first semiconductor pattern SP1-A. The buffer layer BF may prevent contaminants in the base substrate SUB from being diffused into electric components on the base substrate SUB, during a process of fabricating and using a semiconductor device according to some exemplary embodiments of the present disclosure.

Figure 14B:
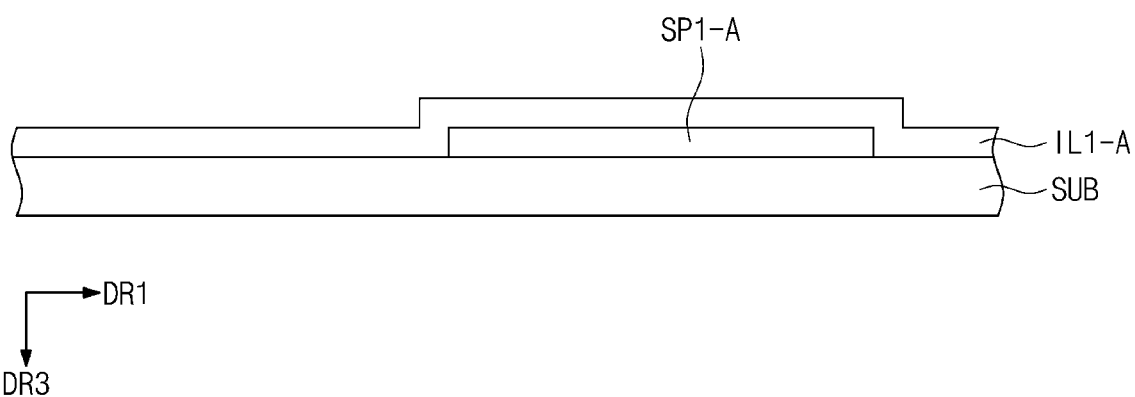

Thereafter, as shown in FIG. 14B, an initial first insulating layer IL1-A may be formed on the base substrate SUB to cover the initial first semiconductor pattern SP1-A. The initial first insulating layer IL1-A may include an inorganic or organic material and may be formed by a deposition, coating, or printing method.

Figure 14C:
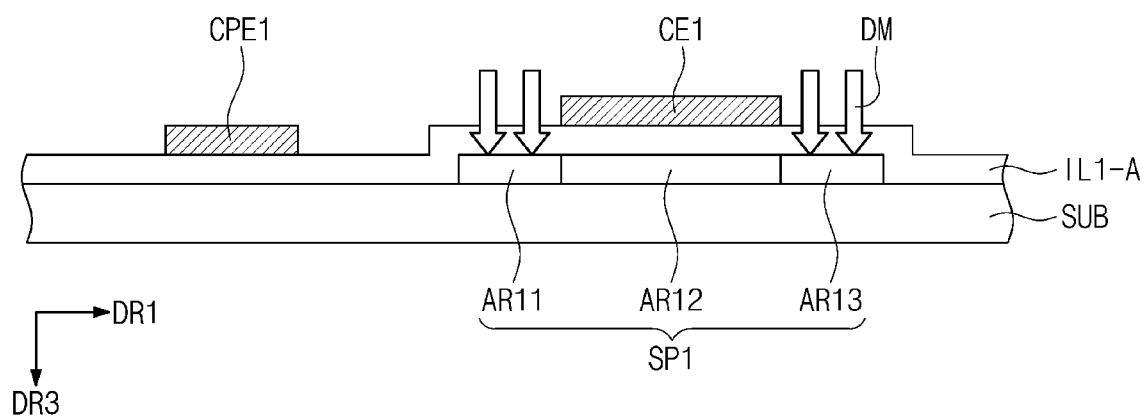

As shown in FIG. 14C, the first control electrode CE1 may be formed on the initial first insulating layer IL1-A. For example, when viewed in a plan view, the first control electrode CE1 may be formed to be overlapped with the initial first semiconductor pattern SP1-A. The formation of the first control electrode CE1 may include forming a conductive layer on the initial first insulating layer IL1-A and pattering the conductive layer. However, the formation of the first control electrode CE1 is not limited to this method.

As shown in FIG. 14C, the first semiconductor pattern SP1 may be formed by defining first to third regions AR11, AR12, and AR13 in the initial first semiconductor pattern SP1-A. For example, the first region AR11 and the third region AR13 may be formed by injecting impurities DM into the initial first semiconductor pattern SP1-A. The first region AR11 and the third region AR13 may be formed to have a doping concentration higher than that of the second region AR12.

Various materials may be used as the impurities DM. In some exemplary embodiments of the present disclosure, the impurities DM may be dopants. In some exemplary embodiments of the present disclosure, the dopants may be acceptors (e.g., elements from group IIII). Here, the first semiconductor pattern SP1 may be formed of a p-type semiconductor material. In certain exemplary embodiments of the present disclosure, the impurities DM may be donors (e.g., elements from group V). In this case, the first semiconductor pattern SP1 may be formed of an n-type semiconductor material.

When viewed in a plan view, the second region AR12 may be overlapped with the first control electrode CE1. For example, a planar shape of the second region AR12 may be the same as that of the first control electrode CE1. The first control electrode CE1 may be used as an ion-blocking mask in a process of injecting dopants into the initial first semiconductor pattern SP1-A. Thus, the borders between the first and second regions AR11 and AR12 and between the second and third regions AR12 and AR13 may be aligned to an edge of the first control electrode CE1.

In some exemplary embodiments of the present disclosure, a method of fabricating a semiconductor device may further include forming a first capacitor. The first capacitor may be formed on the base substrate SUB. The formation of the first capacitor may include forming a first electrode and then forming a second electrode, and here, the first and second electrodes may be formed to face each other.

As shown in FIG. 14C, the first electrode CPE1 may be formed on the initial first insulating layer IL1-A. The first electrode CPE1 may correspond to the first electrode CPE1 shown in FIG. 4. The first electrode CPE1 may be used as an electrode of the first capacitor. The first electrode CPE1 may be disposed at the same level or layer as the first control electrode CE1. For example, each of the first electrode CPE1 and the first control electrode CE1 may be formed to be in contact with a top surface of the initial first insulating layer ILL-A.

Accordingly, the first electrode CPE1 and the first control electrode CE1 may be formed using the same mask. For example, the steps of forming the first electrode CPE1 and the first control electrode CE1 may be performed using a first mask. The steps of forming the first electrode CPE1 and the first control electrode CE1 may be performed in a single step. Thus, in a method of fabricating a semiconductor device according to some exemplary embodiments of the present disclosure, the first electrode CPE1 of the first capacitor can be formed using the step for forming the first control electrode CE1, without an additional process, and thus the semiconductor device may be fabricated more efficiently.

Figure 14D:
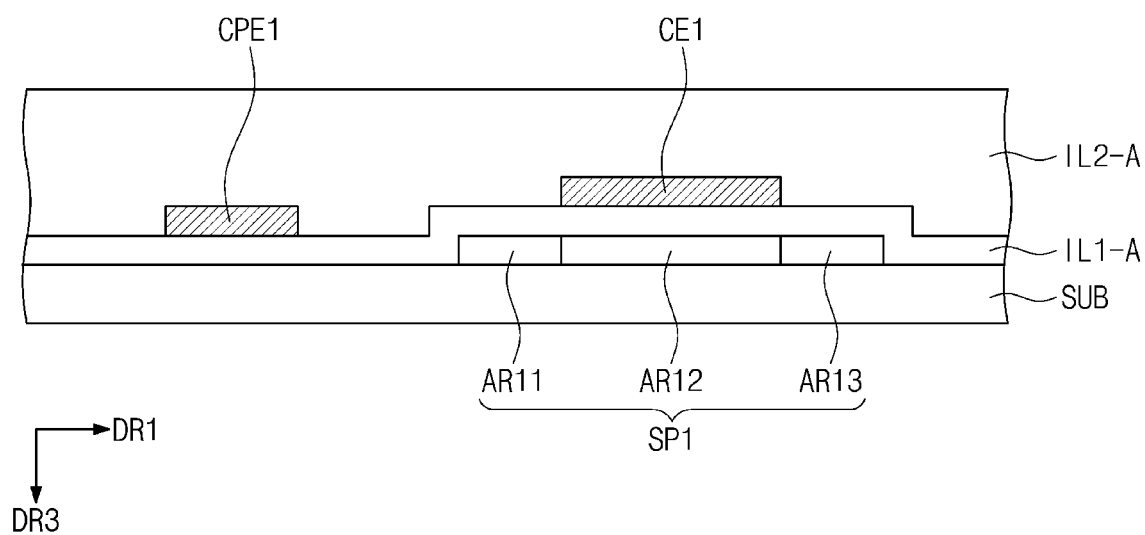

Thereafter, as shown in FIG. 14D, an initial second insulating layer IL2-A may be formed on the initial first insulating layer IL1-A. The initial second insulating layer IL2-A may be formed by depositing, coating, or printing an inorganic or organic material.

Figure 14E:
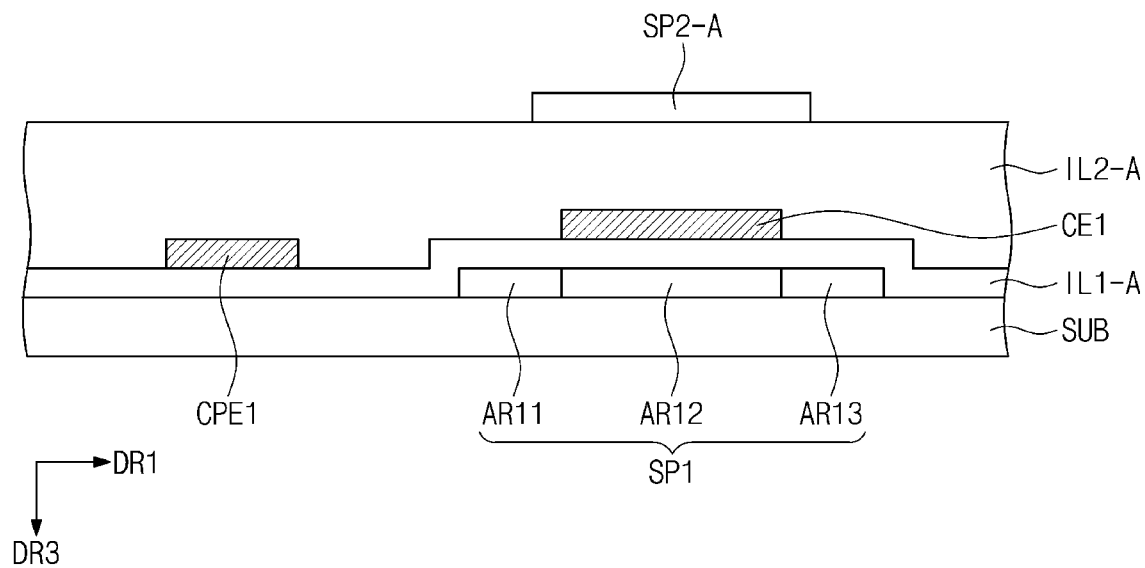

As shown in FIG. 14E, an initial second semiconductor pattern SP2-A may be formed on the initial second insulating layer IL2-A. The initial second semiconductor pattern SP2-A may be formed to be overlapped with the first semiconductor pattern SP1 and the first control electrode CE1, when viewed in a plan view. The initial second semiconductor pattern SP2-A may include an oxide semiconductor material. The initial second semiconductor pattern SP2-A may be formed by forming a layer, in which an oxide semiconductor material is contained, on the initial second insulating layer IL2-A and patterning the layer.

Figure 14F:
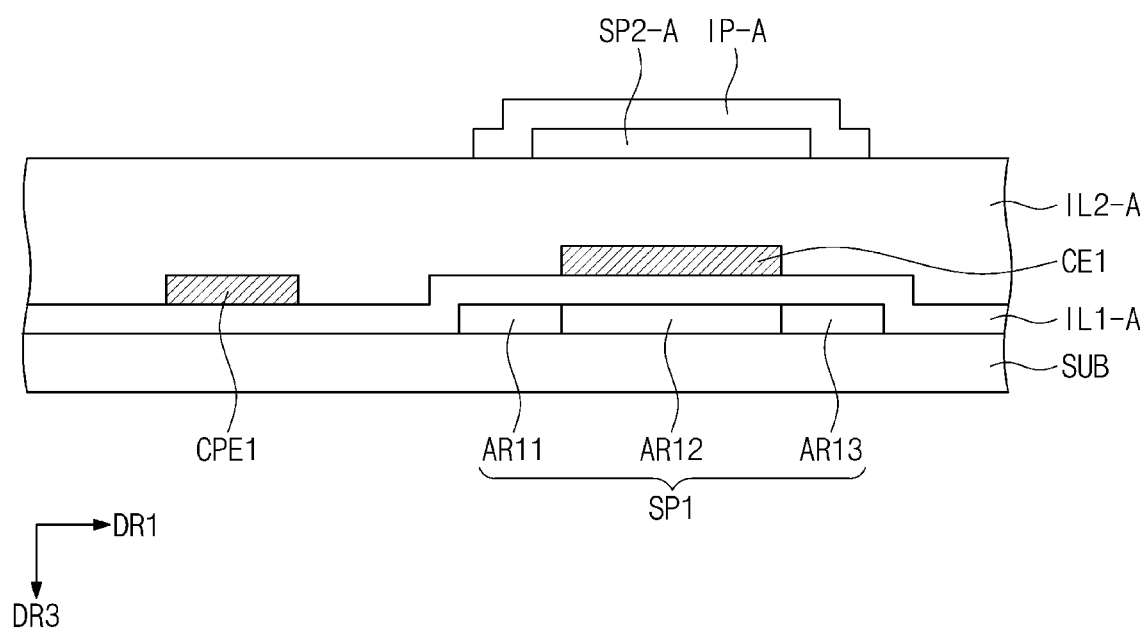

Next, as shown in FIG. 14F, an initial insulating pattern IP-A may be formed on the initial second insulating layer IL2-A to cover the initial second semiconductor pattern SP2-A. The formation of the initial insulating pattern IP-A may include forming a layer, in which at least one of inorganic or organic materials is contained, on the initial second insulating layer IL2-A and the initial second semiconductor pattern SP2-A and then pattering the layer. For example, the initial insulating pattern IP-A may be formed to be overlapped with the first semiconductor pattern SP1, the first control electrode CE1, and the initial second semiconductor pattern SP2-A, when viewed in a plan view.

Figure 14G:
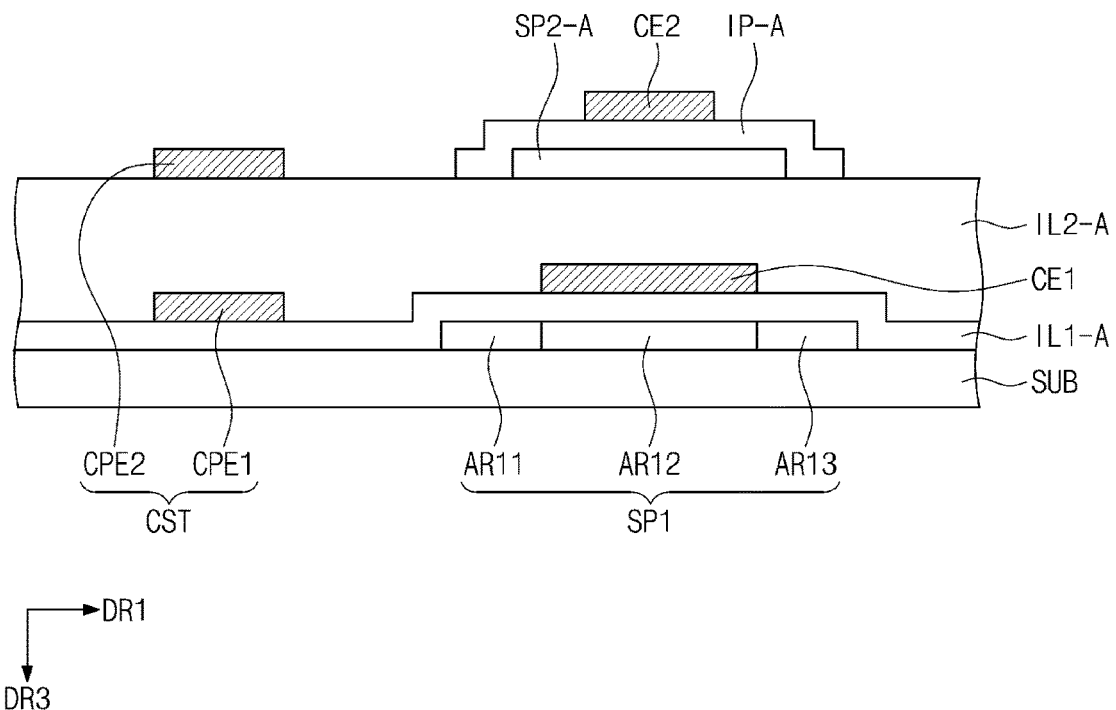

As shown in FIG. 14G, the second control electrode CE2 may be formed on the initial insulating pattern IP-A. The second control electrode CE2 may be formed by forming a conductive layer on the initial second insulating layer IL2-A and the initial insulating pattern IP-A and patterning the conductive layer, but the present disclosure is not limited thereto and alternative configurations may be used. For example, the second control electrode CE2 may be formed to be overlapped with the first semiconductor pattern SP1, the first control electrode CE1, and the initial second semiconductor pattern SP2-A, when viewed in a plan view.

As described above, the formation of the first capacitor may include forming the second electrode CPE2. For example, the second electrode CPE2 may be formed on the initial second insulating layer IL2-A. The second electrode CPE2 may correspond to the second electrode CPE2 shown in FIG. 4. The second electrode CPE2 may be an electrode of the first capacitor. The second electrode CPE2 may be disposed at the same level or layer as the second control electrode CE2. For example, the second electrode CPE2 may be formed to be in contact with a top surface of the initial second insulating layer IL2-A, and the second control electrode CE2 may be formed to be in contact with a top surface of the initial insulating pattern IP-A.

Thus, the second electrode CPE2 and the second control electrode CE2 may be formed using the same mask. For example, the steps of forming the second electrode CPE2 and the second control electrode CE2 may be performed using a second mask. The second mask may be different from the afore-described mask (e.g., the first mask). The steps of forming the second electrode CPE2 and the second control electrode CE2 may be performed in a single step. Thus, in a method of fabricating a semiconductor device according to some exemplary embodiments of the present disclosure, the second electrode CPE2 of the first capacitor can be formed using the step of forming the second control electrode CE2, without an additional process, and thus, the semiconductor device may be fabricated efficiently.

Figure 14H:
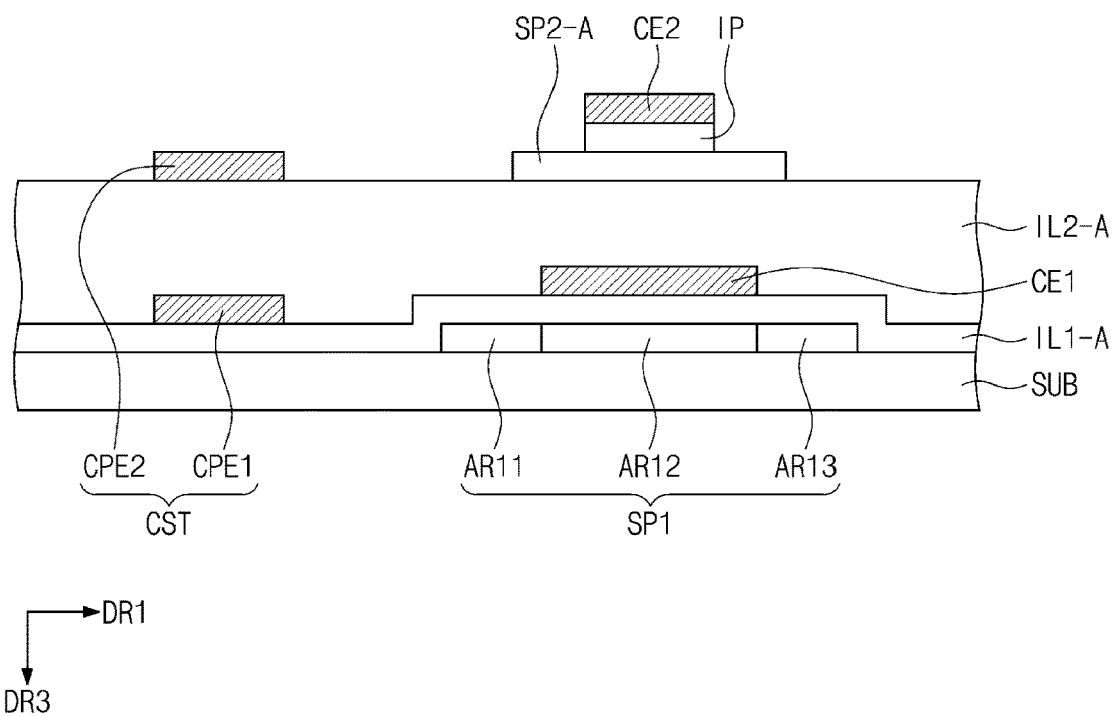

Thereafter, as shown in FIG. 14H, the initial insulating pattern IP-A may be further patterned to form the insulating pattern IP. In the further patterning process, the second control electrode CE2 may be used as an etch mask. Thus, the second control electrode CE2 may be formed to have a side surface that is aligned to that of the insulating pattern IP, and the side surfaces of the second control electrode CE2 and the insulating pattern IP may form a single vertical line. The second control electrode CE2 and the insulating pattern IP may be formed to have the same planar shape as each other.

Figure 14I:
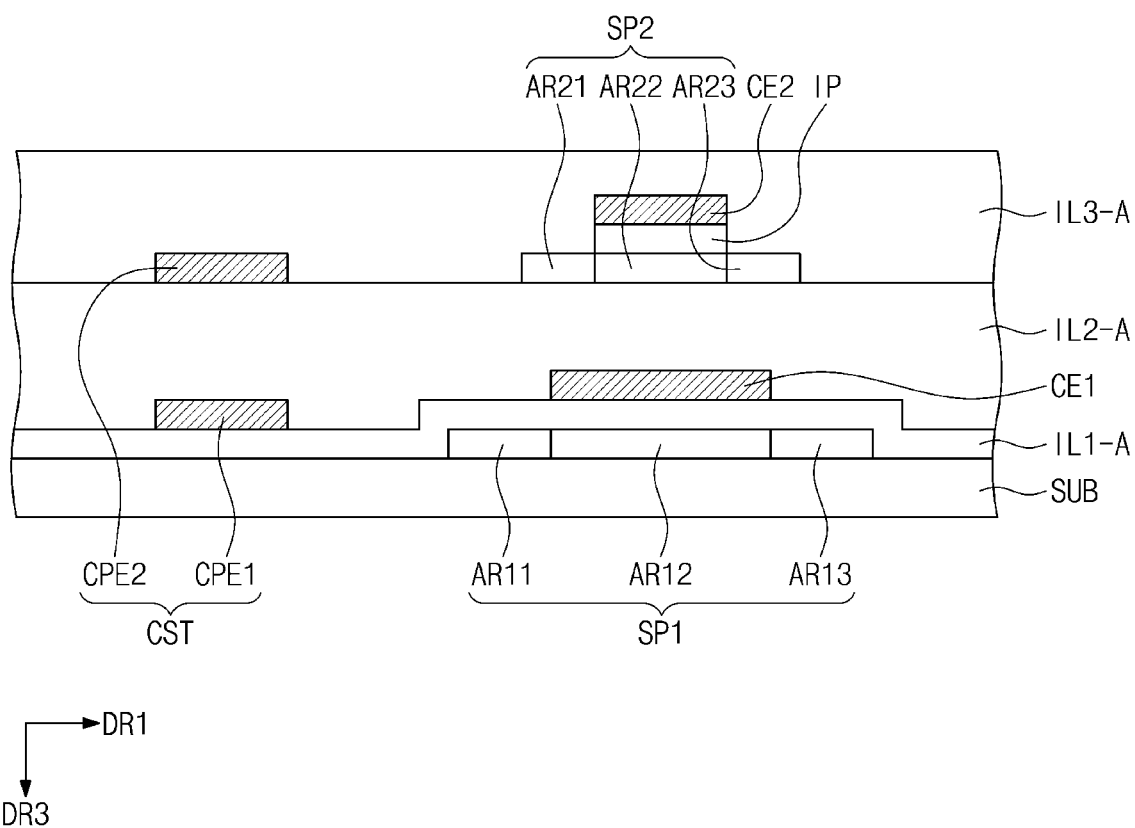

As shown in FIG. 14I, an initial third insulating layer IL3-A may be formed. For example, the formation of the initial third insulating layer IL3-A may include forming or depositing an inorganic material on the initial second insulating layer IL2-A to cover the initial second semiconductor pattern SP2-A, the insulating pattern IP, the second control electrode CE2, and the second electrode CPE2.

The formation of the initial third insulating layer IL3-A may lead to a change in physical or chemical characteristics of exposed regions of the initial second semiconductor pattern SP2-A, which are not covered with the insulating pattern IP, and as a result, the first region AR21, the second region AR22, and the third region AR23 may be defined in the second semiconductor pattern SP2. For example, during a process of forming the initial third insulating layer IL3-A, the exposed regions of the initial second semiconductor pattern SP2-A, which are not covered with the insulating pattern IP, may be doped with impurities or may be reduced by an etching gas to be supplied, and accordingly, the first and third regions AR21 and AR23 may have different physical characteristics from those of the second region AR22. The second region AR22 may have a relatively low concentration of dopants or reduced materials, compared with the first and third regions AR21 and AR23, and thus, the second region AR22 may be used as a channel region of a thin-film transistor.

Figure 14J:
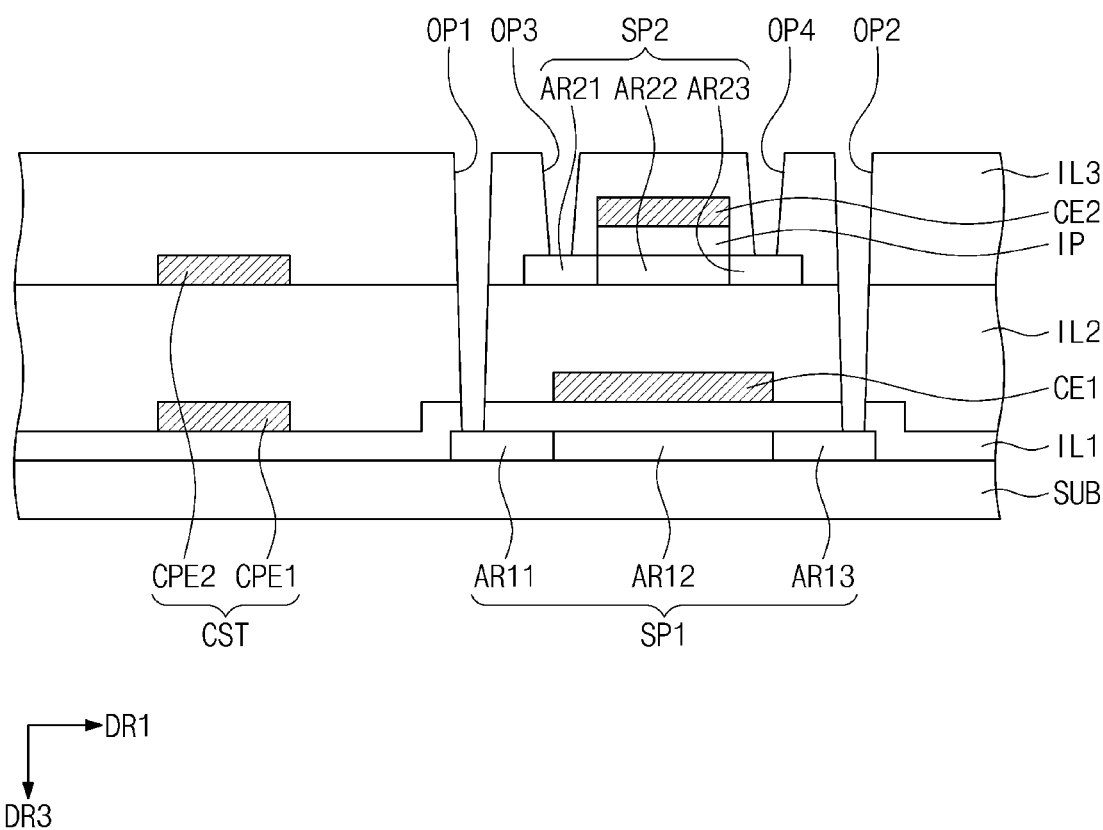

Next, as shown in FIG. 14J, the first to third insulating layers IL1, IL2, and IL3 may be formed by forming first to fourth through holes OP1, OP2, OP3, and OP4. Each of the first through hole OP1 and the second through hole OP2 may be formed to be overlapped with the first semiconductor pattern SP1, and each of the third through hole OP3 and the fourth through hole OP4 may be formed to be overlapped with the second semiconductor pattern SP2. When viewed in a plan view, the third through hole OP3 and the fourth through hole OP4 may be formed to be positioned between the first through hole OP1 and the second through hole OP2. For example, the first through hole OP1 may be formed to be overlapped with the first region AR11 of the first semiconductor pattern SP1, the second through hole OP2 may be formed to be overlapped with the third region AR13 of the first semiconductor pattern SP1, the third through hole OP3 may be formed to be overlapped with the first region AR21 of the second semiconductor pattern SP2, and the fourth through hole OP4 may be formed to be overlapped with the third region AR23 of the second semiconductor pattern SP2.

The first through hole OP1 and the second through hole OP2 may be formed to penetrate the first insulating layer IL1, the second insulating layer IL2, and the third insulating layer IL3. The first through hole OP1 may be formed to expose at least a portion of the first region AR11 of the first semiconductor pattern SP1, and the second through hole OP2 may be formed to expose at least a portion of the third region AR13 of the first semiconductor pattern SP1.

The third through hole OP3 and the fourth through hole OP4 may be formed to penetrate the third insulating layer IL3. The third through hole OP3 may be formed to expose at least a portion of the first region AR21 of the second semiconductor pattern SP2, and the fourth through hole OP4 may be formed to expose at least a portion of the third region AR23 of the second semiconductor pattern SP2.

When viewed in a plan view, the first through hole OP1 and the second through hole OP2 may be formed to be spaced apart from each other in the first direction DR1, and the third through hole OP3 and the fourth through hole OP4 may be formed to be positioned between the first through hole OP1 and the second through hole OP2.

Figure 14K:
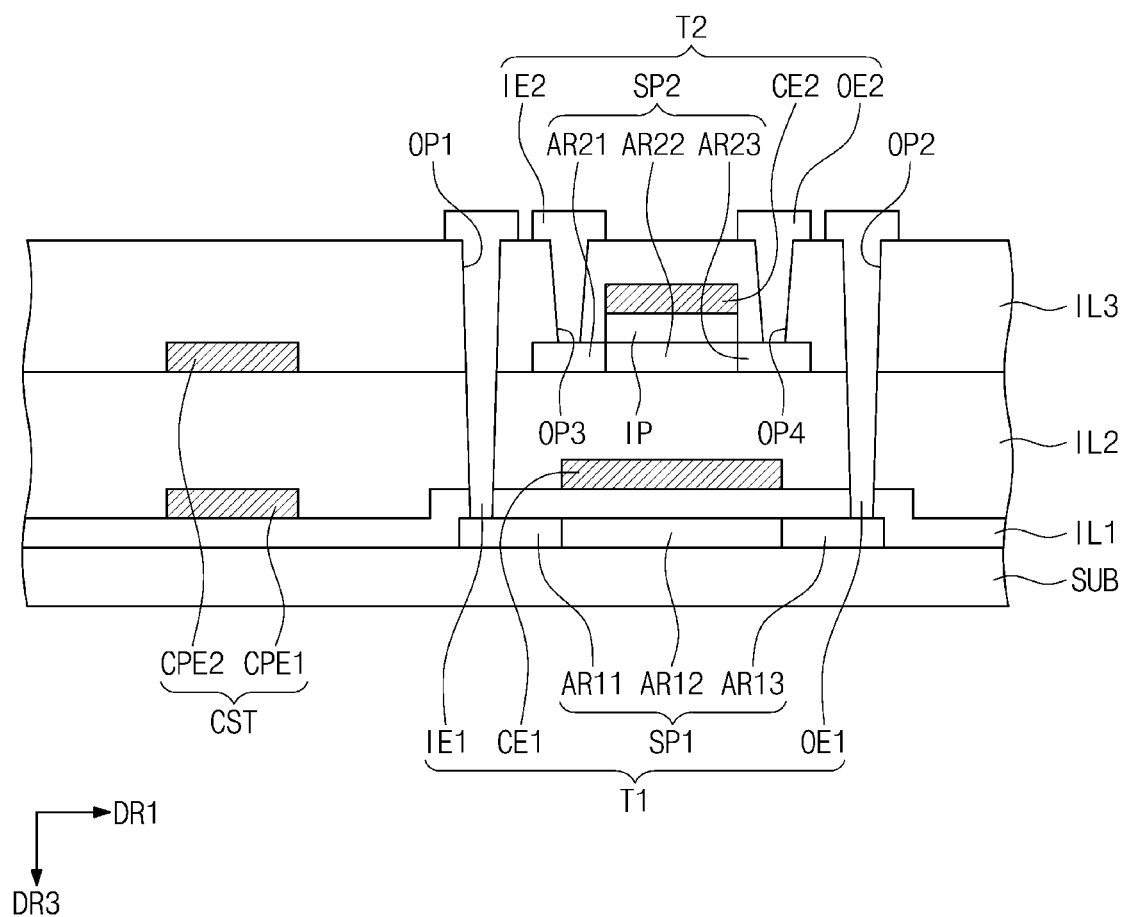

Thereafter, the first input electrode IE1, the first output electrode OE1, the second input electrode IE2, and the second output electrode OE2 may be formed, as shown in FIG. 14K. Each of the first input electrode IE1, the first output electrode OE1, the second input electrode IE2, and the second output electrode OE2 may be formed by forming a layer, in which a conductive material is contained, on the third insulating layer IL3, and patterning the layer. The first input electrode IE1 may be formed to fill the first through hole OP1, the first output electrode OE1 may be formed to fill the second through hole OP2, the second input electrode IE2 may be formed to fill the third through hole OP3, and the second output electrode OE2 may be formed to fill the fourth through hole OP4. Each of the first input electrode IE1, the first output electrode OE1, the second input electrode IE2, and the second output electrode OE2 may include a portion that is located above the third insulating layer IL3.

The first input electrode IE1 may be coupled to the first region AR11 of the first semiconductor pattern SP1 via the first through hole OP1, and the first output electrode OE1 may be coupled to the third region AR13 of the first semiconductor pattern SP1 via the second through hole OP2. The first thin-film transistor T1 may include the first input electrode IE1 and the first output electrode OE1. The second input electrode IE2 may be coupled to the first region AR21 of the second semiconductor pattern SP2 via the third through hole OP3, and the second output electrode OE2 may be coupled to the third region AR23 of the second semiconductor pattern SP2 via the fourth through hole OP4. The second thin-film transistor T2 may include the second input electrode IE2 and the second output electrode OE2.

Next, a light-emitting diode may be formed on the third insulating layer IL3.

In a method of fabricating a semiconductor device according to some exemplary embodiments of the present disclosure, the first semiconductor pattern SP1, the first control electrode CE1, the second semiconductor pattern SP2, and the second control electrode CE2 may be formed to be overlapped with each other in a plan view. Thus, a semiconductor device may be fabricated with high integration density and high resolution. Furthermore, a first capacitor may be formed without additional steps. For example, a first electrode of the first capacitor may be formed using the same mask as that for forming a first control electrode, and a second electrode of the first capacitor may be formed using the same mask as that for forming a second control electrode. For example, in the case where the fabrication method is used, a semiconductor device maybe fabricated in an efficient manner.

Hereinafter, a method of fabricating a semiconductor device, according to some exemplary embodiments of the present disclosure, will be described with reference to FIGS. 15A to 15L. Overlapping description of an element or step previously described with reference to FIGS. 8 to 12 and FIGS. 14A to 14K may be omitted, for brevity's sake and it may be assumed that the non-described elements and steps are at least similar to corresponding elements and steps previously described.

FIGS. 15A to 15L are cross-sectional views sequentially illustrating process steps in a process of fabricating a semiconductor device according to some exemplary embodiments of the present disclosure. For concise description, an element previously described with reference to FIGS. 14A to 14K may be identified by a similar or identical reference number without repeating an overlapping description thereof.

Referring to FIGS. 15A and 15B, the initial first semiconductor pattern SP1-A may be formed on the base substrate SUB, and the initial first insulating layer IL1-A may be formed on the base substrate SUB to cover the initial first semiconductor pattern SP1-A. In some exemplary embodiments of the present disclosure, the process steps may be performed in the same manner as that described with reference to FIGS. 14A and 14B, and a detailed description thereof will be omitted.

Referring to FIG. 15C, the first control electrode CE1, the second control electrode CE2, and the first electrode CPE1 may be formed on the initial first insulating layer IL1-A. However, the first control electrode CE1 and the second control electrode CE2 may be provided as a single object, and in this case, a common control electrode, which acts as both of the first and second control electrodes CE1 and CE2, may be disposed on the initial first semiconductor pattern SP1-A. Each of the first control electrode CE1, the second control electrode CE2, and the first electrode CPE1 may be formed by forming a conductive layer on the initial first insulating layer IL1-A and then patterning the conductive layer.

The first semiconductor pattern SP1 may be formed by defining the first to third regions AR1, AR12, and AR13 in the initial first semiconductor pattern SP1-A (e.g., by injecting impurities DM into the initial first semiconductor pattern SP1-A). This step may be performed in the same manner as that previously described with reference to FIG. 14C.

Next, referring to FIG. 15D, the initial second insulating layer IL2-A may be formed on the initial first insulating layer IL1-A to cover the first control electrode CE1, the second control electrode CE2, and the first electrode CPE1. The initial second insulating layer IL2-A may be formed by depositing, coating, or printing an inorganic or organic material.

Figure 15E:
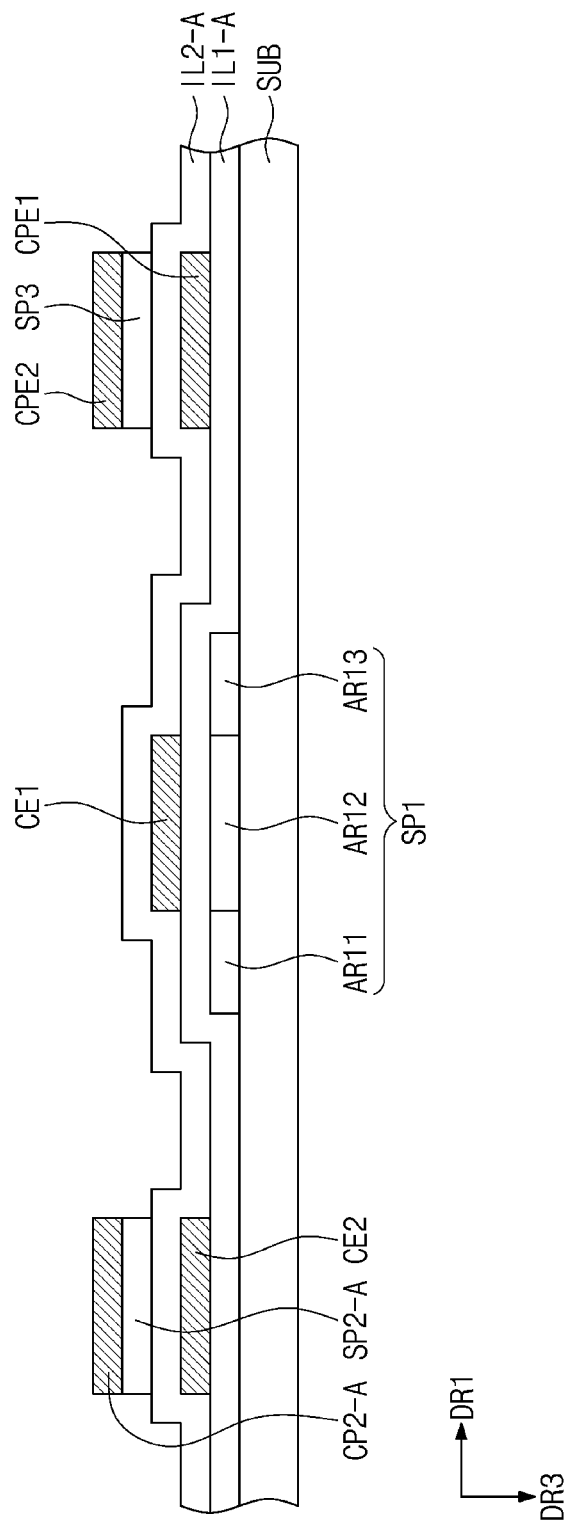

Referring to FIG. 15E, the initial second semiconductor pattern SP2-A and an initial second conductive pattern CP2-A may be sequentially formed on the initial second insulating layer IL2-A to be overlapped with the second control electrode CE2 in a plan view. In addition, the third semiconductor pattern SP3 and the second electrode CPE2 may be sequentially formed on the initial second insulating layer IL2-A to be overlapped with the first electrode CPE1 in a plan view. Each of the initial second semiconductor pattern SP2-A and the third semiconductor pattern SP3 may include an oxide semiconductor material, and in certain exemplary embodiments of the present disclosure, the initial second semiconductor pattern SP2-A and the third semiconductor pattern SP3 may include the same oxide semiconductor material.

The initial second semiconductor pattern SP2-A and the initial second conductive pattern CP2-A may be patterned by the same patterning process and thus they may be formed to have side surfaces that are aligned to each other to form a single vertical line. The initial second semiconductor pattern SP2-A and the initial second conductive pattern CP2-A may be formed to have the same planar shape as each other. The initial second semiconductor pattern SP2-A and the initial second conductive pattern CP2-A may be formed to be in contact with each other.

The third semiconductor pattern SP3 and the second electrode CPE2 may be patterned by the same patterning process, and thus, the third semiconductor pattern SP3 may be formed to have a side surface that is aligned to that of the second electrode CPE2. In some exemplary embodiments of the present invention, the side surfaces of the third semiconductor pattern SP3 and the second electrode CPE2 may form a single vertical line. The third semiconductor pattern SP3 and the second electrode CPE2 may be formed to have the same planar shape as each other. The third semiconductor pattern SP3 and the second electrode CPE2 may be formed to be in contact with each other.

The second control electrode CE2, the initial second semiconductor pattern SP2-A, the third semiconductor pattern SP3, and the second electrode CPE2 may be patterned using the same mask. The mask, which is used to form the second control electrode CE2 and the second electrode CPE2, may be used to form the initial second semiconductor pattern SP2-A and the third semiconductor pattern SP3, and thus, a semiconductor device may be fabricated in an efficient manner.

Figure 15F:
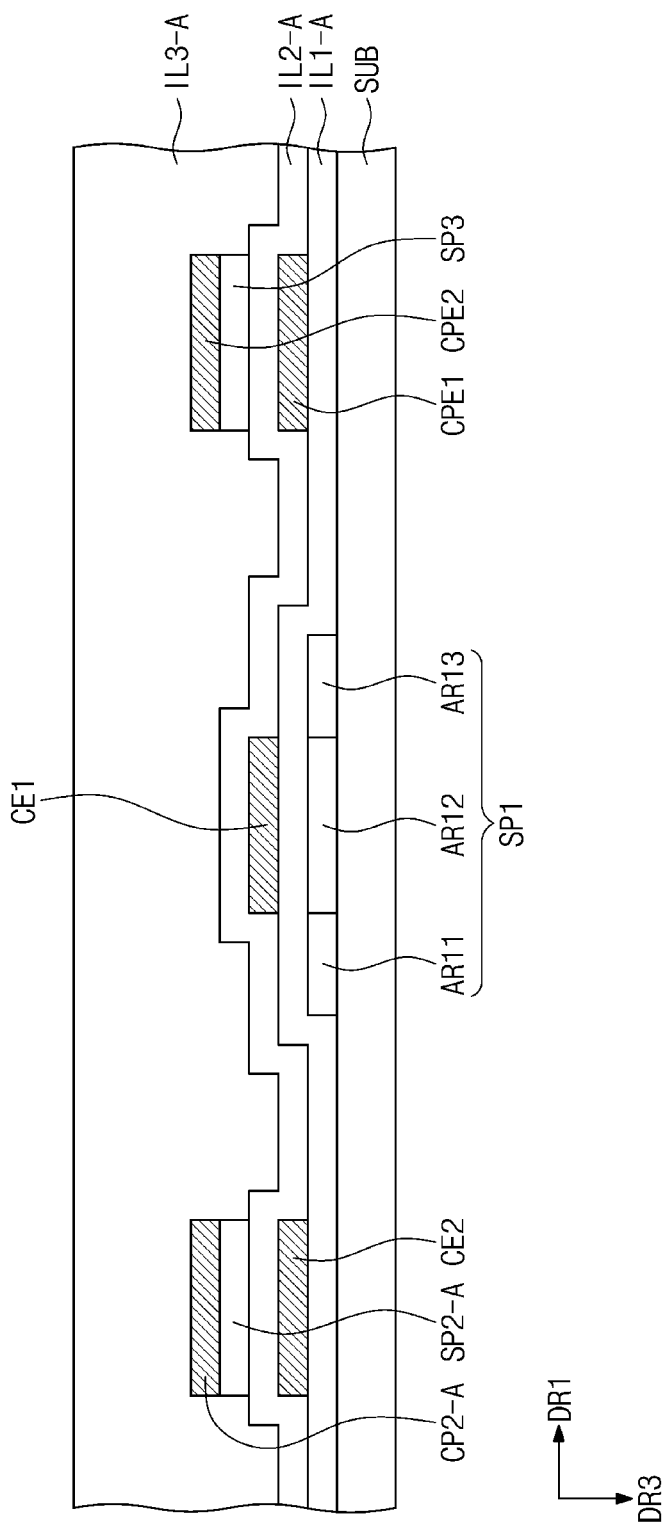

Thereafter, as shown in FIG. 15F, the initial third insulating layer IL3-A may be formed on the initial second insulating layer IL2-A. The initial third insulating layer IL3-A may be formed by depositing an inorganic material. The initial third insulating layer IL3-A may be formed to cover the initial second semiconductor pattern SP2-A, the initial second conductive pattern CP2-A, the third semiconductor pattern SP3, and the second electrode CPE2.

The first electrode CPE1 and the second electrode CPE2 may serve as two electrodes of a capacitor. In the case where conduction characteristics of the third semiconductor pattern SP3 are changed, the third semiconductor pattern SP3 can be used for various purposes. Thus, after the formation of the third semiconductor pattern SP3, an additional process may be performed to adjust the conduction characteristics of the third semiconductor pattern SP3.

Figure 15G:
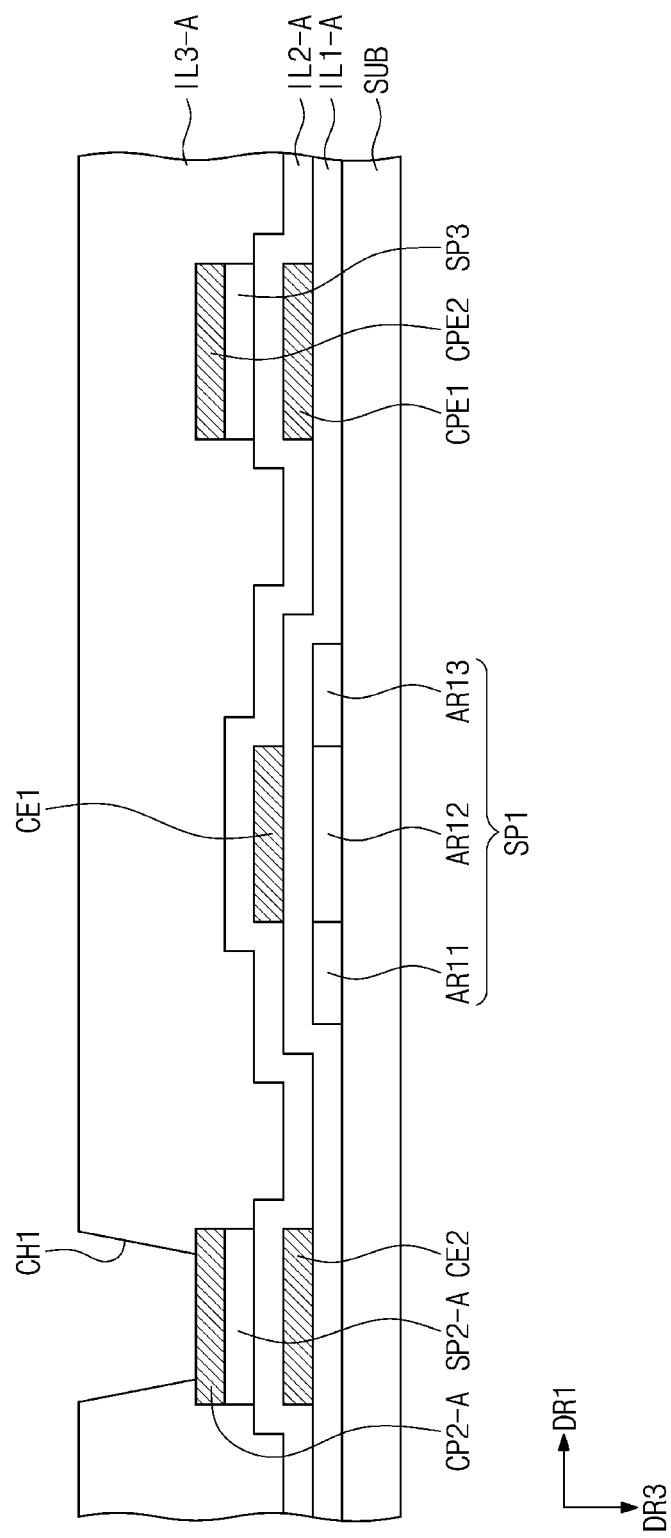

As shown in FIG. 15G, the first contact hole CH1 may be formed in the initial third insulating layer IL3-A. The first contact hole CH1 may be formed to penetrate the initial third insulating layer IL3-A. The first contact hole CH1 may be formed to be overlapped with the initial second conductive pattern CP2-A. The first contact hole CH1 may be formed to expose at least a portion of the initial second conductive pattern CP2-A.

Figure 15H:
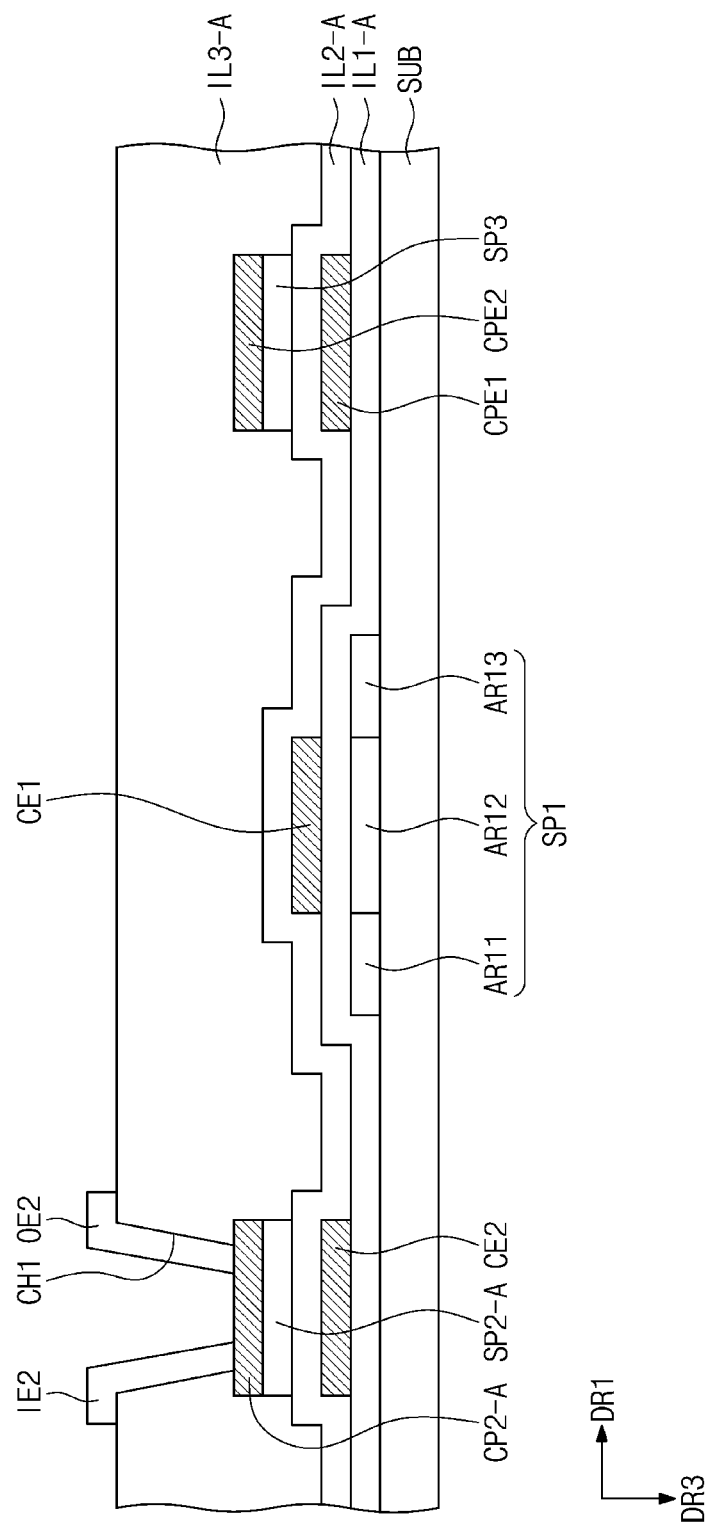

Next, as shown in FIG. 15H, the second input electrode IE2 and the second output electrode OE2 may be formed to be spaced apart from each other. Each of the second input electrode IE2 and the second output electrode OE2 may be formed by forming a conductive layer on the initial third insulating layer IL3-A and patterning the conductive layer, but the present disclosure is not limited thereto and other approaches may be used. The second input electrode IE2 and the second output electrode OE2 may be formed to be spaced apart from each other in the first contact hole CH1, and each of the second input electrode IE2 and the second output electrode OE2 may include a portion positioned above the initial third insulating layer IL3-A. The first contact hole CH1 may include a region, which is not filled with the second input electrode IE2 and the second output electrode OE2 and is formed to expose a portion of the initial second conductive pattern CP2-A.

Figure 15I:
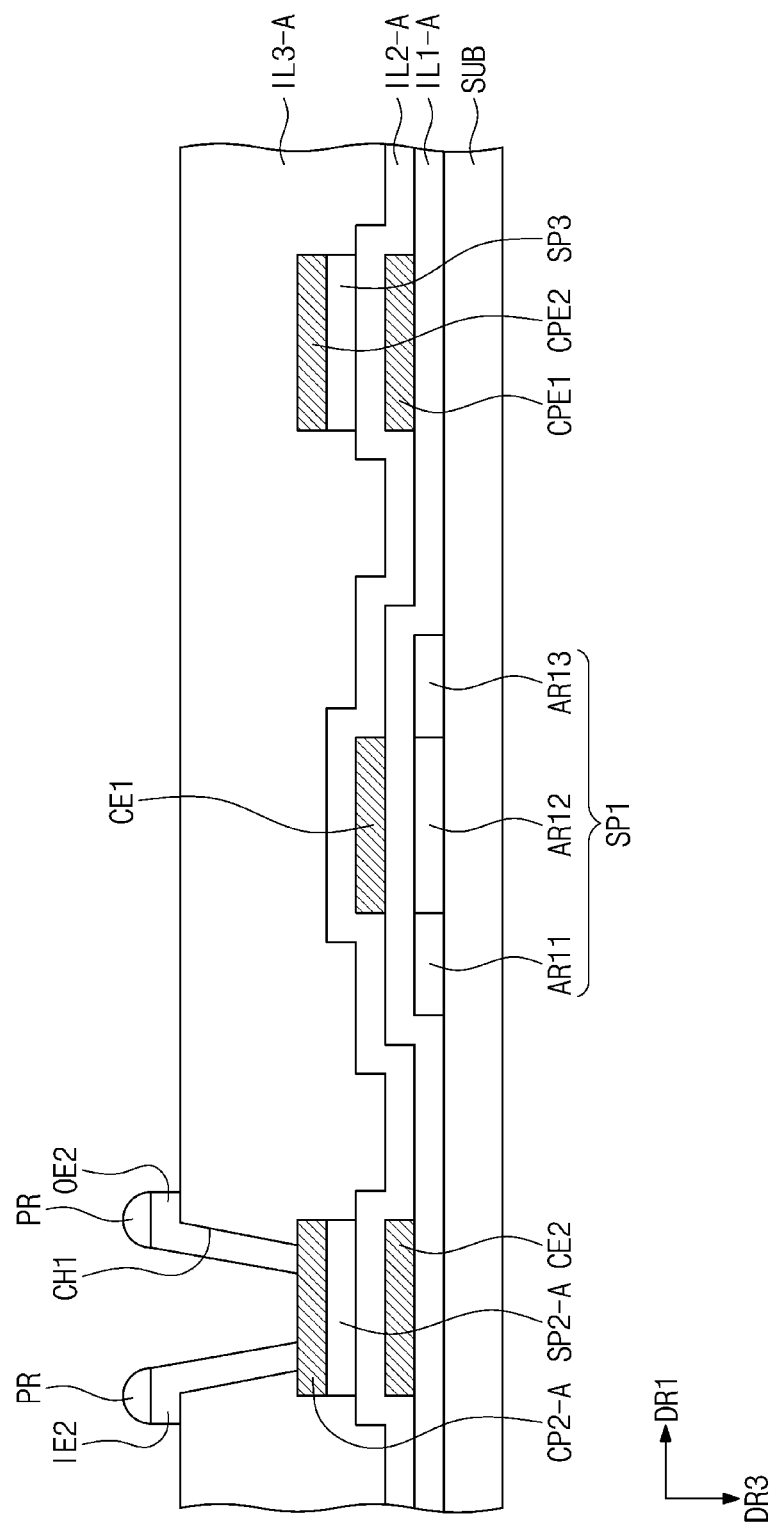
Figure 15J:
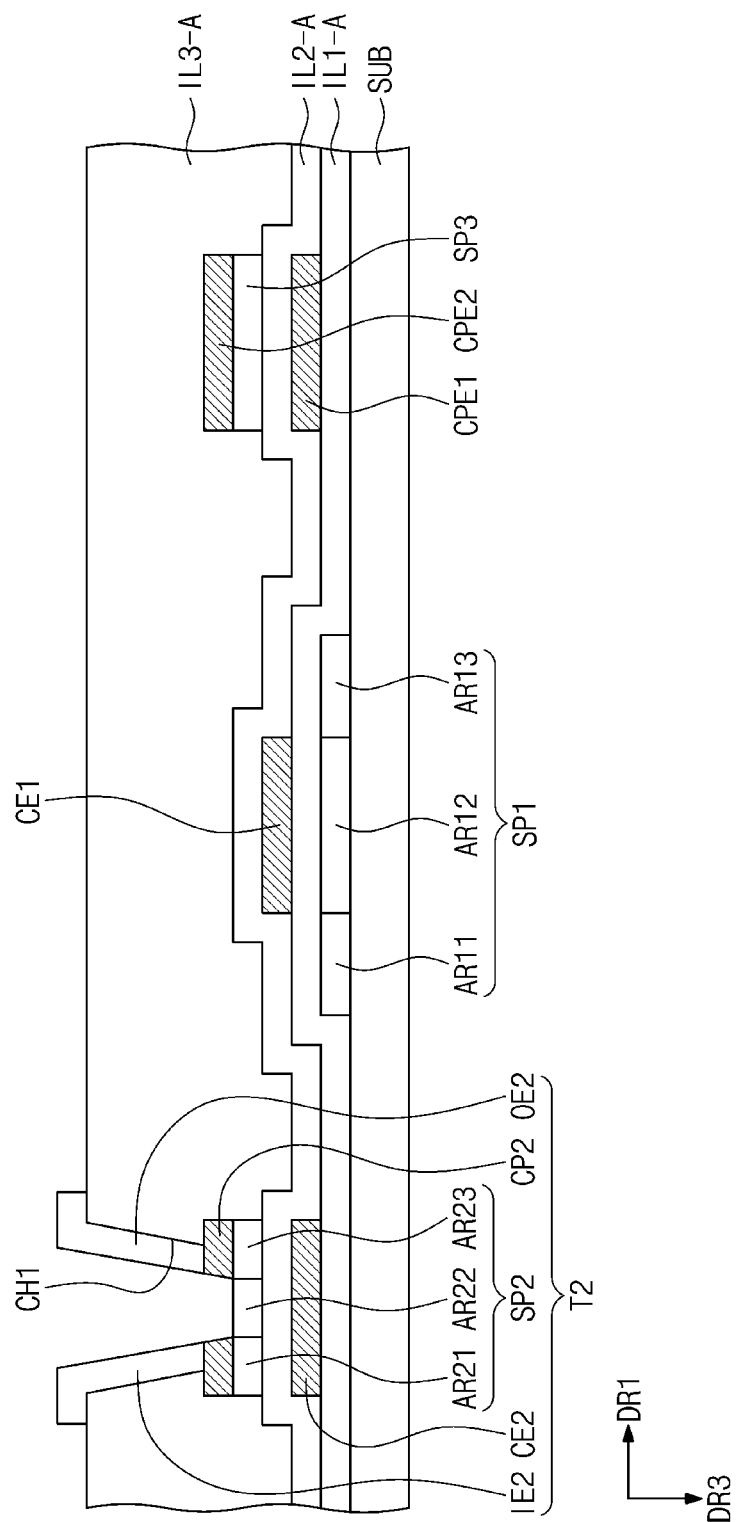

Thereafter, as shown in FIGS. 15I and 15J, the second conductive pattern CP2 may be formed by removing the exposed portion of the initial second conductive pattern CP2-A, which is exposed by the first contact hole CH1 with the second input electrode IE2 and the second output electrode OE2. The second conductive pattern CP2 may be formed by a photolithography process. For example, the formation of the second conductive pattern CP2 may include forming a photoresist PR on the second input electrode IE2 and the second output electrode OE2 and selectively etching the initial second conductive pattern CP2-A using the photoresist PR as an etch mask.

Each of the second input electrode IE2 and the second output electrode OE2 may be coupled to the second conductive pattern CP2 through the first contact hole CH1 and may be used as a part of the second thin-film transistor T2. In the second thin-film transistor T2, the second input electrode IE2 and the second conductive pattern CP2 may serve as an input electrode, and the second output electrode OE2 and the second conductive pattern CP2 may serve as an output electrode.

As a result of this step, the first region AR21, the second region AR22, and the third region AR23 may be defined in the second semiconductor pattern SP2. Each of the first region AR21 and the third region AR23 may be overlapped with the second conductive pattern CP2, and the second region AR22 may be exposed by the second conductive pattern CP2. The second region AR22 may be defined as a channel region.

Figure 15K:
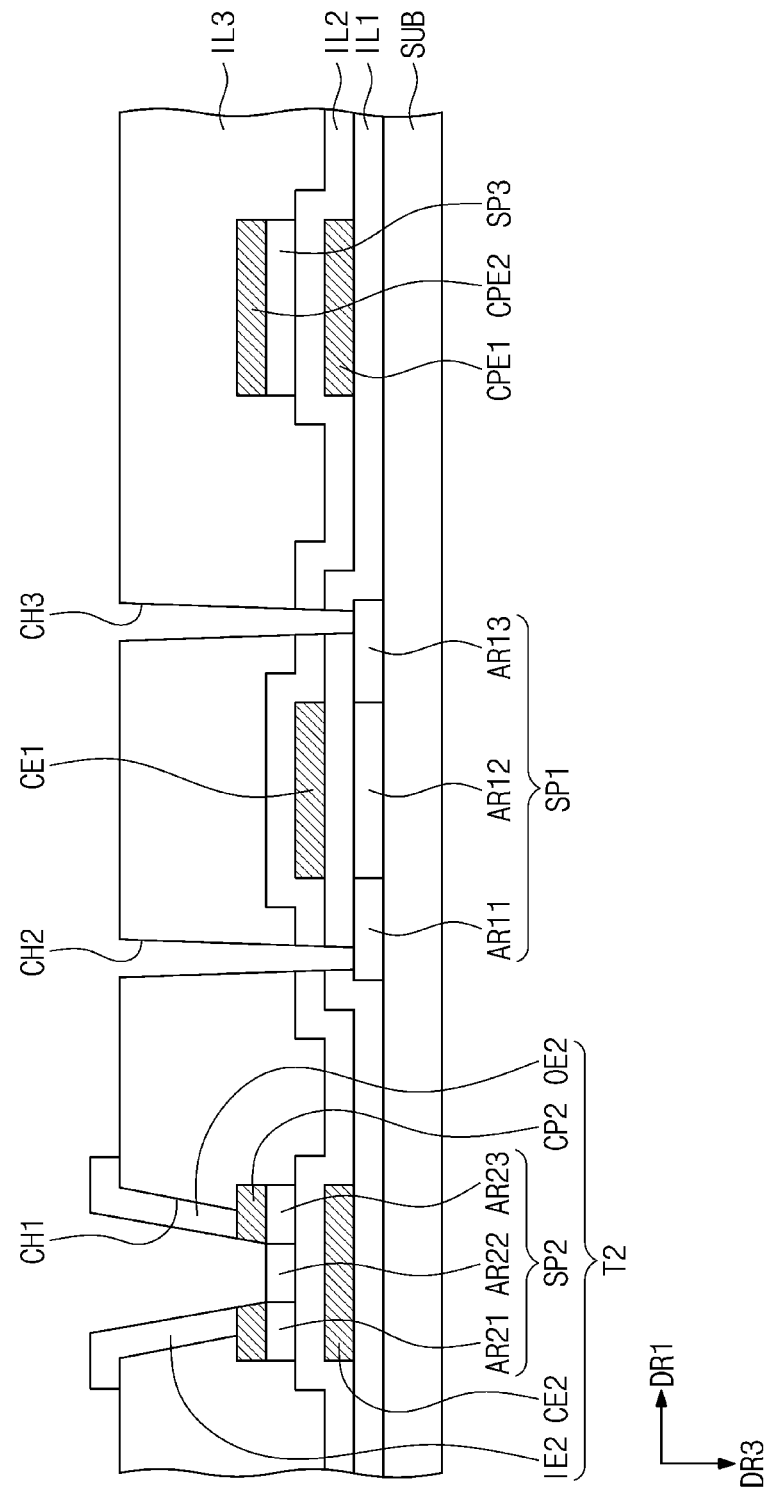

Next, as shown in FIG. 15K, the first to third insulating layers IL1, IL2, and IL3 may be formed by forming the second contact hole CH2 and the third contact hole CH3. The second contact hole CH2 and the third contact hole CH3 may be formed to penetrate the first to third insulating layers IL1, IL2, and IL3.

The second and third contact holes CH2 and CH3 may be spaced apart from each other and each of the second and third contact holes CH2 and CH3 may be formed to be overlapped with the first semiconductor pattern SP1. For example, the second contact hole CH2 may be formed to be overlapped with the first region AR11 of the first semiconductor pattern SP1, and the third contact hole CH3 may be formed to be overlapped with the third region AR13 of the first semiconductor pattern SP1.

The second contact hole CH2 may be formed to expose at least a portion of the first region AR11 of the first semiconductor pattern SP1, and the third contact hole CH3 may be formed to expose at least a portion of the third region AR13 of the first semiconductor pattern SP1.

As described above, the second semiconductor pattern SP2 may be formed to be overlapped with the first semiconductor pattern SP1, when viewed in a plan view, and the first and second control electrodes CE1 and CE2 may be disposed to serve as a single electrode. In this case, when viewed in a plan view, the first contact hole CH1 may be formed in such a way that it is positioned between the second contact hole CH2 and the third contact hole CH3.

Figure 15L:
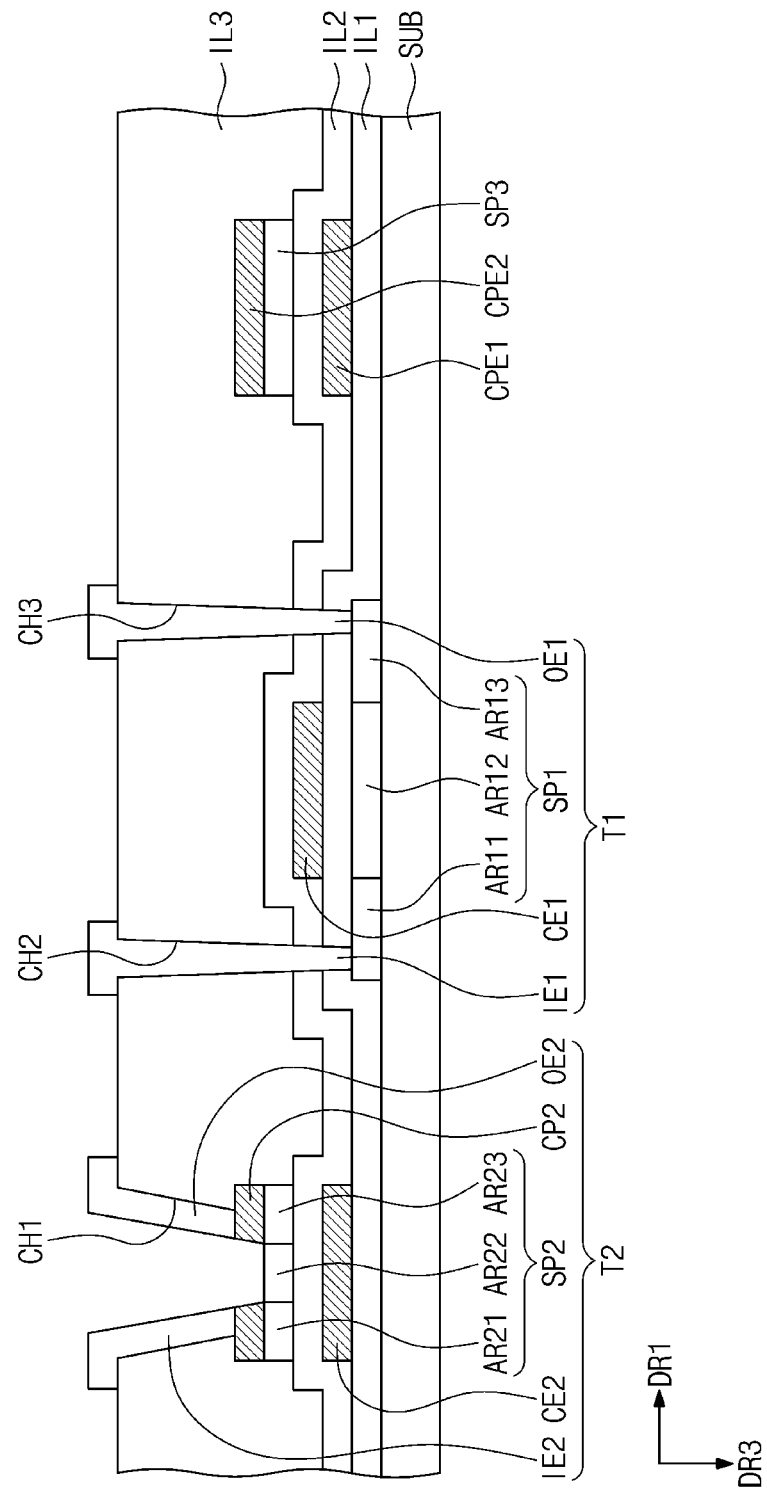

Next, the first input electrode IE1 and the first output electrode OE1 may be formed, as shown in FIG. 15L. Each of the first input electrode IE1 and the first output electrode OE1 may be formed by forming a conductive layer on the third insulating layer IL3 and patterning the conductive layer. The first input electrode IE1 may be formed to fill the second contact hole CH2, and the first output electrode OE1 may be formed to fill the third contact hole CH3. Each of the first input electrode IE1 and the first output electrode OE1 may be formed to have a portion located on the third insulating layer IL3.

The first input electrode IE1 may be coupled to the first region AR1 of the first semiconductor pattern SP1 through the second contact hole CH2, and the first output electrode OE1 may be coupled to the third region AR13 of the first semiconductor pattern SP1 through the third contact hole CH3. The first thin-film transistor T1 may include the first input electrode IE1 and the first output electrode OE1.

According to some exemplary embodiments of the present disclosure, a semiconductor device may include a first semiconductor pattern and a second semiconductor pattern, which are disposed at different levels and are formed of different materials. In a method for fabricating the semiconductor device according to exemplary embodiments of the present invention, a mask for forming a second electrode of a capacitor may be used to form the second semiconductor pattern without using an additional mask, and accordingly, the cost for fabricating the semiconductor device may be reduced. In addition, when the second electrode of the capacitor is formed, a semiconductor pattern may be formed along with the second electrode, and conduction characteristics of the semiconductor pattern may be variously changed. Thus, the capacitance of the semiconductor device may be variously controlled.

According to some exemplary embodiments of the present disclosure, a semiconductor device with high integration density and high resolution may be realized.

According to some exemplary embodiments of the present disclosure, the number of masks required to fabricate a semiconductor device may be reduced, and thus, the fabrication process of the semiconductor device can be performed in a cost-effective manner.

While exemplary embodiments of the present disclosures have been particularly shown and described, it will be understood by one of ordinary skill in the art that variations in form and detail may be made therein without departing from the spirit and scope of the attached claims.

What is claimed is:

1. A semiconductor device, comprising:
a base substrate; and
a first thin-film transistor and a second thin-film transistor disposed on the base substrate,
wherein the first thin-film transistor comprises a first output electrode, a first semiconductor pattern including a crystalline semiconductor material, and a first control electrode disposed on the first semiconductor pattern,
wherein the second thin-film transistor comprises an input electrode, a second output electrode, a second control electrode, a second semiconductor pattern, which is disposed on the second control electrode and including an oxide semiconductor material, and a conductive pattern, which is disposed on the second semiconductor pattern and exposes a portion of the second semiconductor pattern,
wherein the first semiconductor pattern is spaced apart from the second semiconductor pattern, when viewed on a plane,
wherein the conductive pattern is in contact with the first semiconductor pattern and the second semiconductor pattern, and
wherein the conductive pattern is disposed between the input electrode and the second semiconductor pattern and between the second output electrode and the second semiconductor pattern.

2. The semiconductor device of claim 1, wherein the conductive pattern comprises:
a first sub-pattern in contact with the input electrode and the second semiconductor pattern; and
a second sub-pattern spaced apart from the first sub-pattern and in contact with the second output electrode, the first semiconductor pattern, and the second semiconductor pattern, and
wherein the first output electrode is in contact with the first semiconductor pattern.

3. The semiconductor device of claim 2, wherein the input electrode is disposed on the second semiconductor pattern, the first sub-pattern is disposed between the input electrode and the second semiconductor pattern, the second output electrode is disposed on the second semiconductor pattern, and the second sub-pattern is disposed between the second output electrode and the second semiconductor pattern.

4. The semiconductor device of claim 2, further comprising:
a first insulating layer disposed between the first semiconductor pattern and the first control electrode and extending under the second control electrode;
a second insulating layer disposed between the second control electrode and the second semiconductor pattern and extending over the first control electrode; and
a third insulating layer disposed on the conductive pattern and the second insulating layer.

5. The semiconductor device of claim 4, wherein the input electrode and the second output electrode are in contact with the first sub-pattern and the second sub-pattern through a contact hole defined in the third insulating layer, respectively, and
wherein the first output electrode is in contact with the first semiconductor pattern through a contact hole, which penetrates the first, second, and third insulating layers.

6. The semiconductor device of claim 4, wherein the second sub-pattern is in contact with the first semiconductor pattern through a contact hole, which penetrates the second semiconductor pattern, the second insulating layer, and the first insulating layer.

* * * * *